(12) United States Patent
Oda

(10) Patent No.: US 10,353,256 B2
(45) Date of Patent: Jul. 16, 2019

(54) ARRAY SUBSTRATE AND LIQUID CRYSTAL DISPLAY

(71) Applicant: Mitsubishi Electric Corporation, Tokyo (JP)

(72) Inventor: Koji Oda, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 164 days.

(21) Appl. No.: 15/417,371

(22) Filed: Jan. 27, 2017

(65) Prior Publication Data

US 2017/0242283 A1    Aug. 24, 2017

(30) Foreign Application Priority Data

Feb. 19, 2016    (JP) .................................. 2016-029561

(51) Int. Cl.
| | |
|---|---|
| *G02F 1/136* | (2006.01) |
| *G02F 1/1362* | (2006.01) |
| *G02F 1/1368* | (2006.01) |
| *G02F 1/1333* | (2006.01) |
| *H01L 27/12* | (2006.01) |
| *H01L 29/786* | (2006.01) |
| *G02F 1/1343* | (2006.01) |

(52) U.S. Cl.
CPC ...... *G02F 1/136204* (2013.01); *G02F 1/1368* (2013.01); *G02F 1/133345* (2013.01); *G02F 1/136209* (2013.01); *H01L 27/124* (2013.01); *H01L 27/1225* (2013.01); *G02F 2001/134372* (2013.01); *G02F 2201/121* (2013.01); *G02F 2202/02* (2013.01); *G02F 2202/10* (2013.01); *H01L 29/7869* (2013.01)

(58) Field of Classification Search
CPC .................................................. G02F 1/136204
USPC ............................................................ 349/40
See application file for complete search history.

(56) References Cited

U.S. PATENT DOCUMENTS

| | | | |
|---|---|---|---|
| 6,333,769 B1 * | 12/2001 | Suzuki | ............. G02F 1/136204 349/141 |
| 8,492,806 B2 | 7/2013 | Yamazaki et al. | |
| 8,530,813 B2 | 9/2013 | Okada | |
| 8,791,456 B2 | 7/2014 | Yamazaki et al. | |

(Continued)

FOREIGN PATENT DOCUMENTS

| | | |
|---|---|---|
| JP | 2010-092036 A | 4/2010 |
| JP | 5080172 B2 | 11/2012 |
| JP | 2015-092601 A | 5/2015 |

*Primary Examiner* — Richard H Kim
(74) *Attorney, Agent, or Firm* — Studebaker & Brackett PC

(57) ABSTRACT

An array substrate according to the present invention includes a non-linear element. The non-linear element includes a first insulation film disposed so as to cover a light-shielding body, an oxide semiconductor film disposed on the first insulation film so as to overlap the light-shielding body in a plan view, a source electrode and a drain electrode that are disposed so as to be apart from each other with a separation portion therebetween on the oxide semiconductor film, a second insulation film disposed so as to cover the oxide semiconductor film, the source electrode, and the drain electrode, and a first back electrode disposed on a third insulation film and connected to a source wire through a first contact hole. The first back electrode is disposed so as to overlap the source electrode and part of the separation portion on the oxide semiconductor film in a plan view.

19 Claims, 15 Drawing Sheets

(56) References Cited

U.S. PATENT DOCUMENTS

| | | |
|---|---|---|
| 9,385,114 B2 | 7/2016 | Yamazaki et al. |
| 2010/0065840 A1 | 3/2010 | Yamazaki et al. |
| 2010/0084650 A1* | 4/2010 | Yamazaki .......... H01L 27/1225 257/43 |
| 2010/0276604 A1* | 11/2010 | Okada ............... H01L 27/14603 250/370.09 |
| 2014/0118673 A1* | 5/2014 | Park ................. G02F 1/133345 349/138 |
| 2016/0254257 A1 | 9/2016 | Yamazaki et al. |

* cited by examiner

F I G . 1
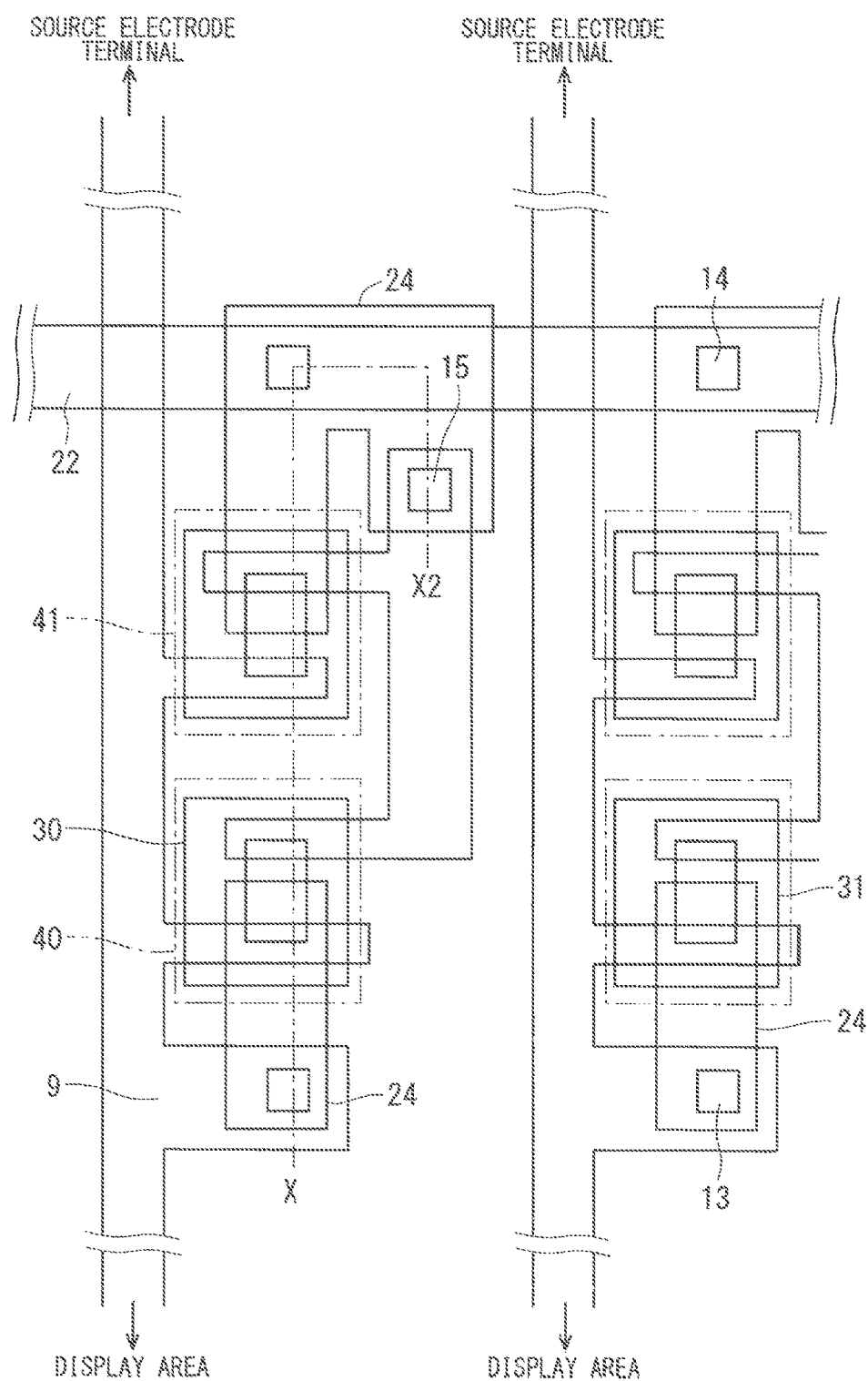

F I G. 9
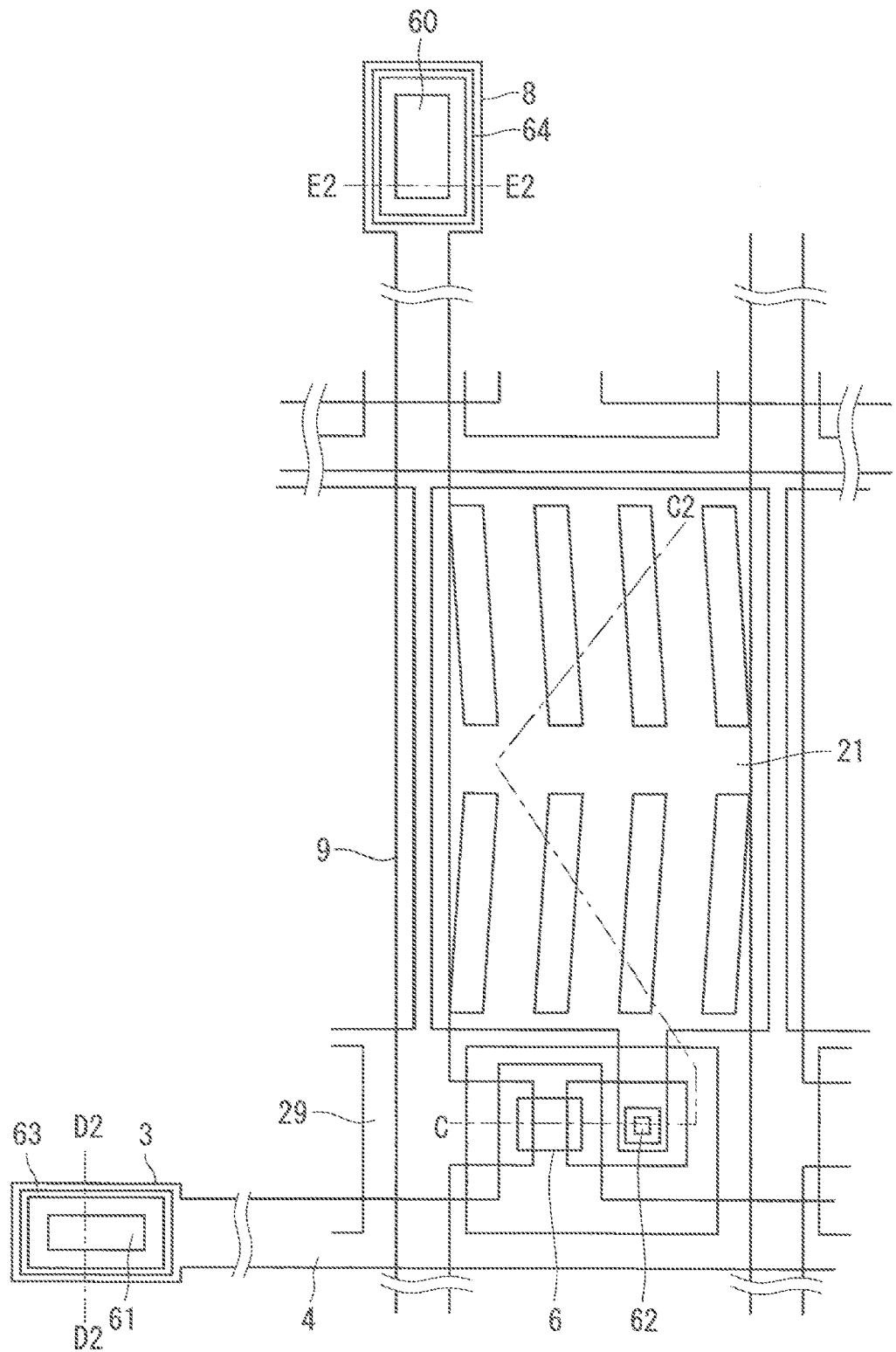

F I G. 1 0
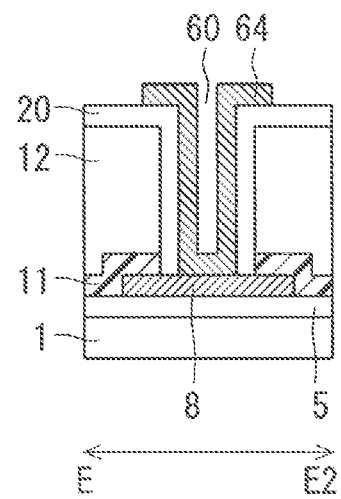
F I G. 1 1
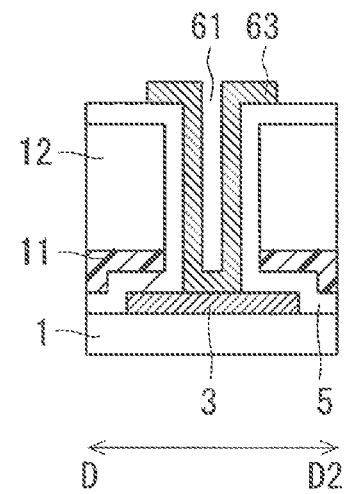

F I G . 1 6
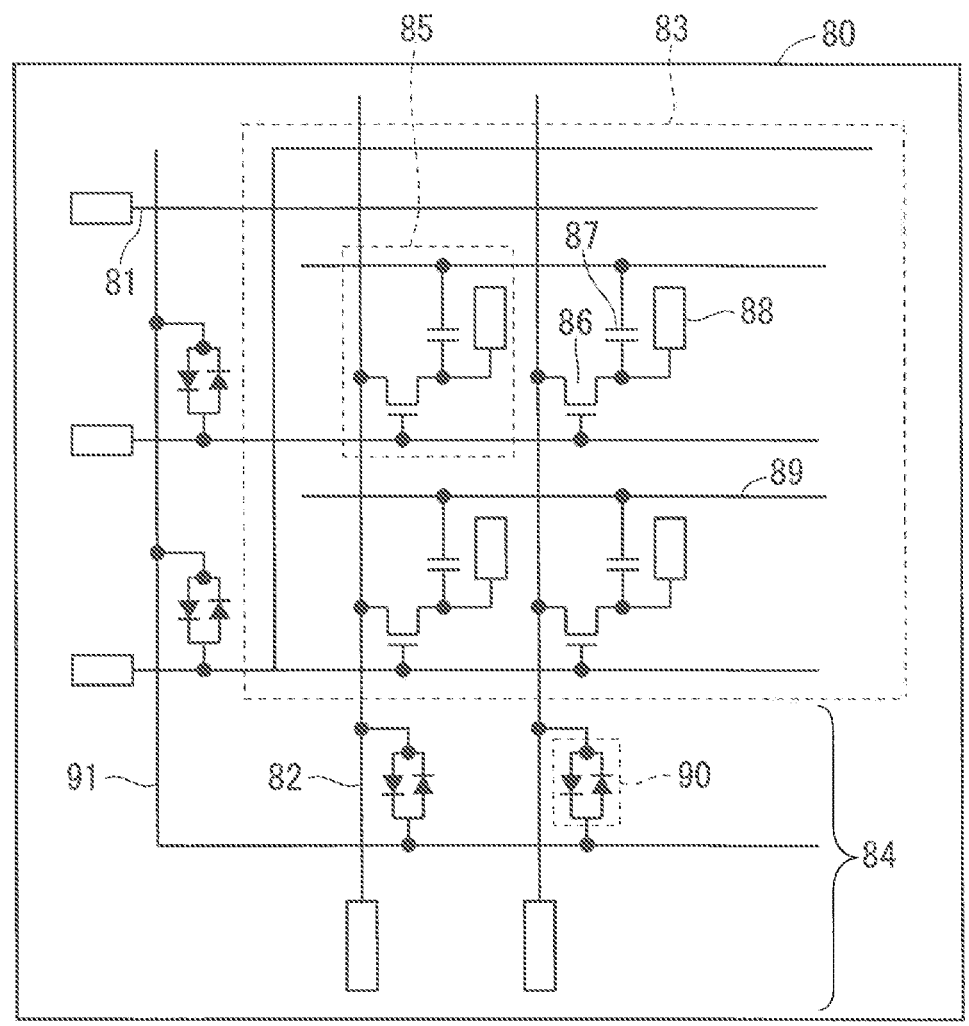

ARRAY SUBSTRATE AND LIQUID CRYSTAL DISPLAY

BACKGROUND OF THE INVENTION

Field of the Invention

The present invention relates to an array substrate including a non-linear element and also relates to a liquid crystal display including the array substrate.

Description of the Background Art

Common examples of liquid crystal display modes include the twisted nematic (TN) mode and the transverse electric field mode for achieving a wide viewing angle and a high contrast, such as the in-plane switching mode and the fringe field switching (FFS) mode. Liquid crystal displays employing the IPS mode perform display by applying a transverse electric field to liquid crystals sandwiched between opposed substrates. In such a liquid crystal display, a pixel electrode and a common electrode to which the transverse electric field is applied are located on the same layer. Thus, the liquid crystal display fails to drive liquid crystal molecules located above the pixel electrode sufficiently and has a low transmittance accordingly. Meanwhile, a liquid crystal display employing the FFS mode is capable of driving liquid crystal molecules located above the pixel electrode by using a fringe electric filed, and thus, has a transmittance higher than that of the liquid crystal display employing the IPS mode.

In such a common matrix liquid crystal display, display materials including liquid crystals are sandwiched between two substrates opposed to each other such that a voltage can be selectively applied to the display materials. At least one of the two substrates is referred to as a matrix array substrate (hereinafter simply referred to as an "array substrate"). On the array substrate, switching elements such as thin film transistors, source wires, and gate wires are arranged in array. The source and gate wires provide signals to the switching elements.

In general, the array substrate is an insulation substrate made of, for example, glass. Thus, a short circuit arising from electrical breakdown or the like is more likely to occur between the source wire and the gate wire due to static electricity created in the manufacturing process. A common workaround to this problem is to dispose a low-resistance wire, which is referred to as a short ring wire, on the periphery of the array substrate. The short ring wire is connected to the source wire through a bidirectional diode (a protection circuit) and is also connected to the gate wire through another bidirectional diode. In this configuration, the source wire and the gate wire are at the same potential (see, for example, Japanese Patent No. 5080172 and Japanese Patent Application Laid-Open No. 2010-092036).

Each diode included in the protection circuit is required to have a reasonably high resistance. The conventional diode made of amorphous silicon with a channel length of about 5 to 10 μm and a channel width of about 5 to 10 μm offers an acceptable diode resistance because an amorphous silicon film included in the diode has a high resistance.

In order to provide a high definition display or a display with an on-board driving circuit, considerable work has been done on the development of thin film transistors (TFT's) including oxide semiconductors, as alternatives to conventional TFTs made of amorphous silicon. Such an oxide semiconductor has a mobility that is two orders of magnitude greater than that of an amorphous silicon film and also has a higher carrier concentration, so that the diode resistance of the oxide semiconductor is two to three orders of magnitude lower than that of the amorphous silicon film. The diode with increased resistance inevitably has a longer channel length, which may be as long as several tens of micrometers. The diode element increases in size due to such an increase in channel length, and a frame region of the array substrate expands accordingly, making it difficult to obtain an array substrate with a narrow frame. To solve the above-mentioned problems, a structure has been disclosed which includes a source electrode disposed on an oxide semiconductor layer, a drain electrode disposed below the oxide semiconductor layer, and a gate electrode disposed so as to cover a sidewall of the oxide semiconductor layer. In this structure, the gate electrode is connected to the source electrode or the drain electrode, and the sidewall of the oxide semiconductor functions as a channel (see, for example, Japanese Patent Application Laid-Open No. 2015-092601).

While being processed, the oxide semiconductor layer included in the structure disclosed in Japanese Patent Application Laid-Open No. 2015-092601 is susceptible to etching damage, with a defect in the surface of the sidewall of the oxide semiconductor layer. A leakage current is likely to occur in the defect. In this structure, the channel length is short, so that the leakage current is more likely to occur, making it difficult to control resistance.

SUMMARY OF THE INVENTION

The present invention has an object to provide both an array substrate including a non-linear element and a liquid crystal display including the array substrate.

An array substrate includes a substrate and a non-linear element. The non-linear element is disposed on the substrate and includes a light-shielding body disposed on the substrate, a first insulation film disposed so as to cover the light-shielding body, a first oxide semiconductor film disposed on the first insulation film so as to overlap the light-shielding body in a plan view, a first source electrode and a first drain electrode that are disposed so as to be apart from each other with a separation portion therebetween on the first oxide semiconductor film, a second insulation film disposed so as to cover the first oxide semiconductor film, the first source electrode, and the first drain electrode, and a first back electrode disposed on the second insulation film and connected to a source wire through a contact hole. The first back electrode is disposed so as to overlap the first source electrode and part of the separation portion on the first oxide semiconductor film in a plan view.

In the present invention, the array substrate includes a substrate and a non-linear element. The non-linear element is disposed on the substrate and includes the light-shielding body disposed on the substrate, the first insulation film disposed so as to cover the light-shielding body, the first oxide semiconductor film disposed on the first insulation film so as to overlap the light-shielding body in a plan view, the first source electrode and the first drain electrode that are disposed so as to be apart from each other with the separation portion therebetween on the first oxide semiconductor film, the second insulation film disposed so as to cover the first oxide semiconductor film, the first source electrode, and the first drain electrode, and the first back electrode disposed on the second insulation film and connected to the source wire through the contact hole. The first back electrode is disposed so as to overlap the first source electrode and part of the separation portion on the first oxide semiconductor film in a plan view. Thus, the non-linear element offers high diode resistance and contributes to the reduced frame width.

These and other objects, features, aspects and advantages of the present invention will become more apparent from the following detailed description of the present invention when taken in conjunction with the accompanying drawings.

BRIEF DESCRIPTION OF THE DRAWINGS

FIG. 1 is a plan view of an example configuration of a non-linear element adjacent to a source wire according to a first preferred embodiment of the present invention;

FIG. 9 is a plan view of an example configuration of an FFS array substrate according to a third preferred embodiment of the present invention;

FIG. 10 is a cross-sectional view taken along the line E-E2 of FIG. 9;

FIG. 11 is a cross-sectional view taken along the line D-D2 of FIG. 9;

FIG. 16 is a plan view of an example configuration of an array substrate according to a premise technique.

DESCRIPTION OF THE PREFERRED EMBODIMENTS

Figure 2:
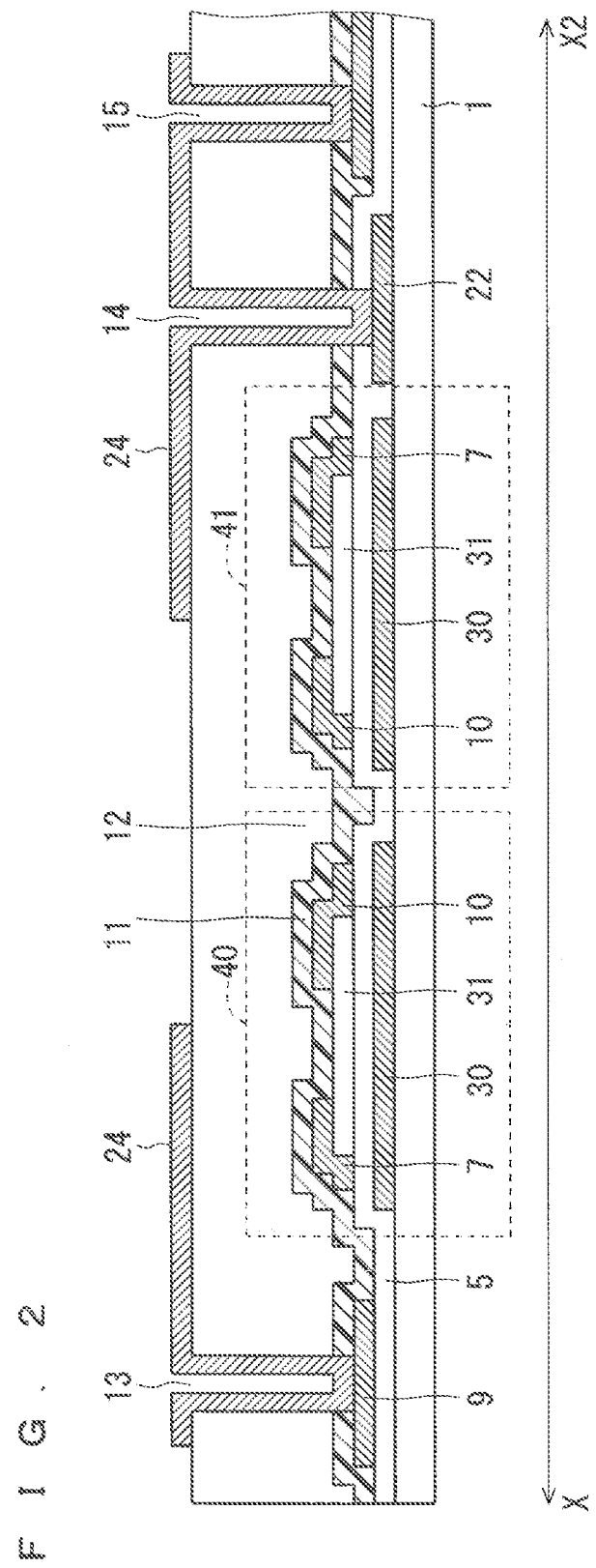
FIG. 2 is a cross-sectional view taken along the line X-X2 of FIG. 1.

Embodiments of the present invention will be described below with reference to the drawings.

Premise Technique

Firstly, the following will describe a technique on which the present invention is premised (a premise technique).

FIG. 16 is a plan view of an example configuration of an array substrate 80 according to the premise technique.

As illustrated in FIG. 16, provided on the array substrate 80 are a plurality of gate wires 81 (scanning lines) and a plurality of source wires 82 (signal lines) that cross each other. In each intersection of the gate wire 81 and the source wire 82, a pixel 85 is disposed. A plurality of pixels 85 arranged in matrix constitutes a pixel portion 83. The area surrounding the pixel portion 83 of the array substrate 80 is a frame area 84.

The individual pixel 85 includes a pixel transistor 86 connected to both the gate wire 81 and the source wire 82, a holding capacitance portion 87, and a pixel electrode 88. In the illustration of FIG. 16, one end of the holding capacitance portion 87 is connected to a pixel transistor 86 and the other end of the holding capacitance portion 87 is connected to an accumulation capacitance line 89. The pixel electrode 88 is one of electrodes that drive display elements (liquid crystal elements).

In order to avoid electrostatic breakdown (the above-mentioned short circuit arising from electrical breakdown) during manufacturing, each of the gate wires 81 and the source wires 82 on the array substrate 80 is connected to a short ring wire 91 through the corresponding one of bidirectional diodes 90 included in protection circuits. The bidirectional diodes 90 are formed in the frame area 84.

Figure 17:
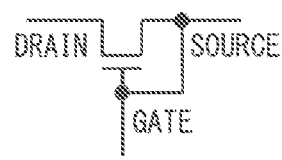
FIGS. 17 and 18 are diagrams for describing a bidirectional diode according to the premise technique.

As illustrated in FIG. 17, each of the diodes constituting the bidirectional diodes 90 on an array substrate made of, for example, amorphous silicon has a configuration in which a gate electrode and a source electrode (or a drain electrode) of each TFT are connected with each other. The actual bidirectional diode has a configuration illustrated in FIG. 18. Specifically, the gate and the drain of a diode 92 is connected to the gate wire 81 and the source of the diode 92 is connected to the short ring wire 91. The gate and the drain of a diode 93 is connected to the short ring wire 91 and the source of the diode 93 is connected to the gate wire 81. In the protection circuit including the diode 92 and the diode 93 illustrated in FIG. 18, two transistors are connected to both the gate wire 81 and the short ring wire 91 in a manner to rectify a current in reverse directions.

Figure 18:
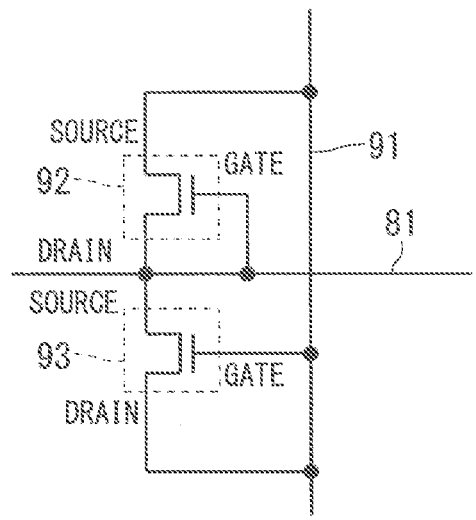

With reference to FIG. 18, when the gate wire 81 is charged positively or negatively with respect to the short ring wire 91 due to static electricity or the like, a current flows in a manner to neutralize electrical charges. When the gate wire 81 is positively charged, a current flows in a manner to dissipate the positive charges through the short ring wire 91. Such an operation can avoid electrostatic breakdown or the threshold voltage shift in the pixel transistor 86 that is connected to the gate wire 81 bearing electrical charges. This operation can also avoid electrical breakdown in an insulation layer located between the gate wire 81 bearing electrical charges and another wire, which cross each other with the insulation layer therebetween.

Each diode included in the protection circuit is required to have a relatively high resistance, as mentioned above. Driving a display apparatus normally requires a voltage of 20 to 30 V. A current flowing through the diode during the application of such a normal voltage interferes with the proper application of a set voltage across pixels, causing a display failure. The workaround to this problem is to increase the diode resistance by extending the channel length or reducing the channel width. The conventional diode made of amorphous silicon with a channel length of about 5 to 10 μm and a channel width of about 5 to 10 μm offers an acceptable diode resistance because the amorphous silicon film included in the diode has a high resistance.

Meanwhile, considerable work has been done on the development of TFTs including oxide semiconductors, as alternatives to TFTs made of amorphous silicon. These oxide semiconductors, which are considered as promising next-generation materials, are materials based on, for example, zinc oxide (ZnO) or amorphous InGaZnO obtained by adding gallium oxide ($Ga_2O_3$) and indium oxide ($In_2O_3$)

to ZnO. Such an oxide semiconductor has a mobility that is two orders of magnitude greater than that of an amorphous silicon film and also has a high carrier concentration, so that the diode resistance of the oxide semiconductor is two to three orders of magnitude smaller than that of the amorphous silicon film. The diode with increased resistance inevitably has a longer channel length, which may be as long as several tens of micrometers. The diode element increases in size due to such an increase in channel length, and the frame region of the array substrate expands accordingly, making it difficult to obtain an array substrate with a narrow frame. The technique disclosed in Japanese Patent Application Laid-Open No. 2015-092601 may be a workaround to this problem but has the above-mentioned drawbacks. The present invention therefore has been made to solve these problems and will be described below in detail.

First Preferred Embodiment

The following will describe a configuration of a non-linear element (bidirectional diode) connected to a source wire.

FIG. 1 is a plan view of an example configuration of a bidirectional diode adjacent to a source wire according to a first preferred embodiment of the present invention. FIG. 2 is a cross-sectional view taken along the line X-X2 of FIG. 1.

As illustrated in FIGS. 1 and 2, a light-shielding body 30 and a short ring wire 22, which are formed by processing a first conducive film made of metal or the like, are located on a substrate 1. The substrate 1 is a transparent insulation substrate made of, for example, glass. Here, the first conductive film is used to form a low-resistance wire that is to be formed into the short ring wire 22. Alternatively, the low-resistance wire may be formed of a second conductive film, which will be described below.

The light-shielding body 30 and the short ring wire 22 are covered with a first insulation film 5 (a first insulation film). Provided on the first insulation film 5 is an oxide semiconductor film 31 (a first oxide semiconductor film), which is formed so as to overlap the light-shielding body 30 in a plan view. The oxide semiconductor film 31 lies inboard with respect to the light-shielding body 30 in a plan view.

A source electrode 7 (a first source electrode) and a drain electrode 10 (a first drain electrode), which are formed of the second conductive film, are apart from each other with a separation portion therebetween on the oxide semiconductor film 31. The oxide semiconductor films 31, each of which is located between the individual source electrode 7 and the individual drain electrode 10, function as channels of a first diode 40 and a second diode 41. The second conductive film is formed into a source electrode terminal (not shown) and a source wire 9, and extends over a display area.

The first insulation film 5, the source electrode 7, the source wire 9, the drain electrode 10, and the oxide semiconductor film 31 are covered with a second insulation film 11. The second insulation film 11 is covered with a third insulation film 12. The second insulation film 11 may be an inorganic insulation film, whereas the third insulation film 12 may be an organic insulation film having planarization properties.

Provided on the third insulation film 12 is a first back electrode 24 (a first back electrode) formed of a third conductive film. The first back electrode 24 adjacent to the first diode 40 is electrically connected to the source wire 9 through a first contact hole 13. The first back electrode 24 adjacent to the second diode 41 is electrically connected to the short ring wire 22 through a second contact hole 14 and is also electrically connected to the source electrode 7 of the second diode 41 through a third contact hole 15. The drain electrode 10 of the first diode 40 is integral with the source electrode 7 of the second diode 41 (these electrodes serve as one electrode).

The first back electrode 24 is formed so as to overlap the source electrode 7 of each of the first diode 40 and the second diode 41 in a plan view and to overlap part of the oxide semiconductor film 31 in a plan view. Although FIGS. 1 and 2 illustrate the first back electrode 24 overlapping the source electrodes 7 in a plan view, the configuration is not limited thereto. For example, the first back electrode 24 may be formed so as to overlap the drain electrode 10 in a plan view.

As mentioned above, the first diode 40 and the second diode 41, which rectify the current in reverse directions, constitute a bidirectional diode. The source wire 9 and the short ring wire 22 are connected with each other though the bidirectional diode.

The following will describe a configuration of the non-linear element (the bidirectional diode) connected to the gate wire.

Figure 3:
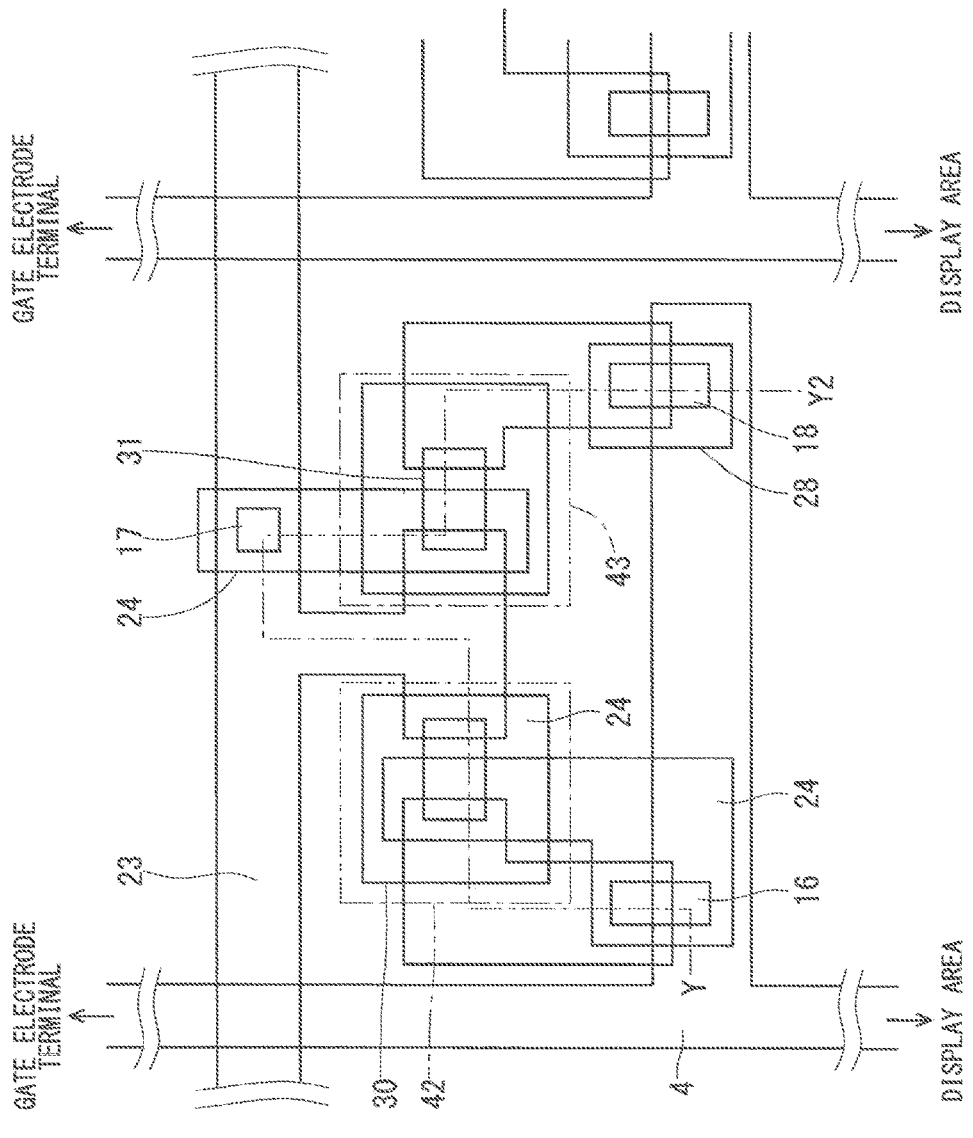
FIG. 3 is a plan view of an example configuration of a non-linear element adjacent to a gate wire according to the first preferred embodiment of the present invention.
Figure 4:
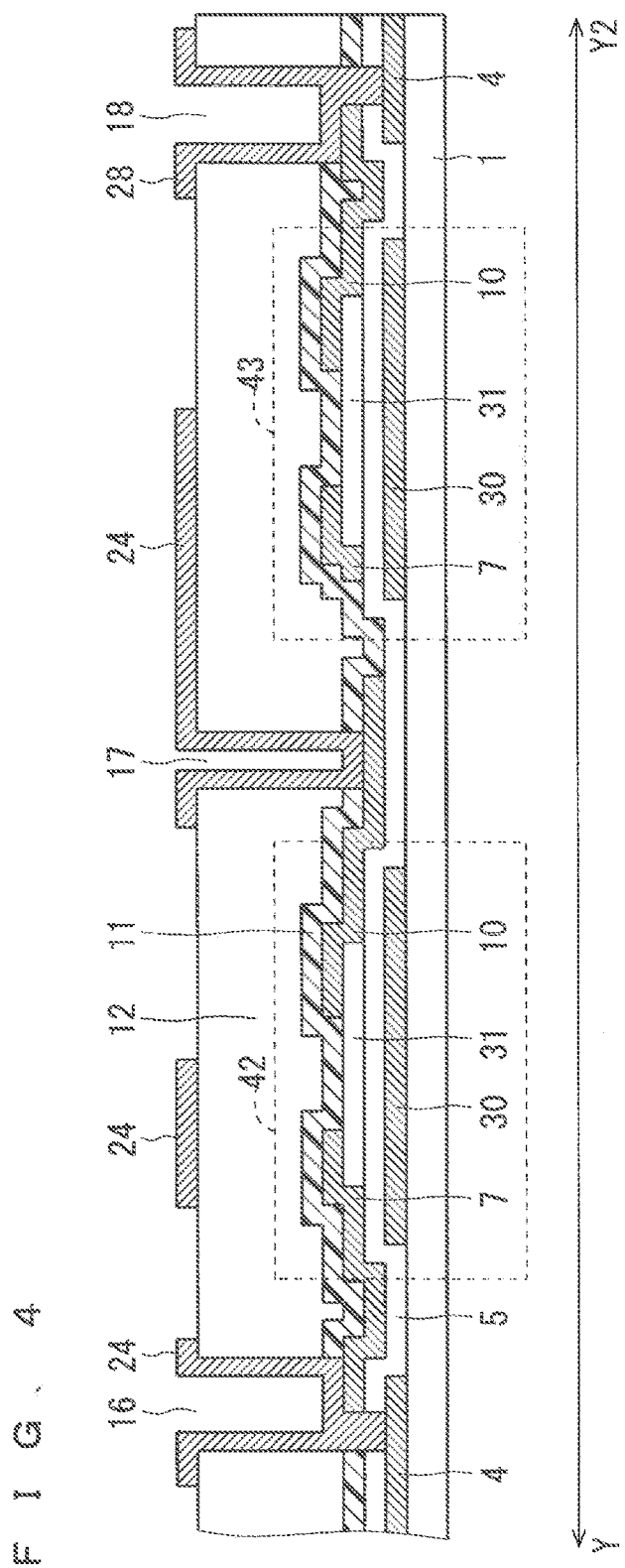
FIG. 4 is a cross-sectional view taken long the line Y-Y2 of FIG. 3.

FIG. 3 is a plan view of an example configuration of a bidirectional diode adjacent to the gate wire according to the first preferred embodiment. FIG. 4 is a cross-sectional view taken along the line Y-Y2 of FIG. 3.

As illustrated in FIGS. 3 and 4, provided on the substrate 1 is the light-shielding body 30 and a gate wire 4, which are formed of the first conductive film. The gate wire 4 extends over the display area. In addition, a gate electrode terminal (not shown) formed of the first conductive film is located on the substrate 1.

The first insulation film 5 is formed so as to cover the light-shielding body 30, the gate wire 4, and the gate electrode terminal. The oxide semiconductor film 31 is formed on the first insulation film 5 so as to overlap the light-shielding body 30 in a plan view. The oxide semiconductor film 31 lies inboard with respect to the light-shielding body 30 in a plan view.

The source electrode 7 and the drain electrode 10 that are formed of the second conductive film are apart from each other on the oxide semiconductor film 31. The oxide semiconductor films 31, each of which is located between the source electrode 7 and the drain electrode 10, function as channels of a third diode 42 and a fourth diode 43. In addition, a short ring wire 23 is formed.

The second insulation film 11 is formed so as to cover the first insulation film 5, the source electrode 7, the drain electrode 10, and the oxide semiconductor film 31. The third insulation film 12 is formed so as to cover the second insulation film 11. The second insulation film 11 may be an inorganic insulation film, whereas the third insulation film 12 may be an organic insulation film having planarization properties.

Provided on the third insulation film 12 is the first back electrode 24 and a connection wire 28, which are formed of the third conductive film. The first back electrode 24 adjacent to the third diode 42 is electrically connected to the gate wire 4 and the source electrode 7 of the third diode 42 through a fourth contact hole 16. The first back electrode 24 adjacent to the fourth diode 43 is electrically connected to the short ring wire 23 through a fifth contact hole 17. The connection wire 28 is electrically connected to both the drain electrode 10 of the fourth diode 43 and the gate wire 4 through a sixth contact hole 18. The drain electrode 10 of the third diode 42 is integral with the source electrode 7 of the fourth diode 43 (through the short ring wire 23).

The first back electrode 24 is formed so as to overlap the source electrode 7 of each of the third diode 42 and the fourth diode 43 in a plan view and to overlap part of the oxide semiconductor film 31 in a plan view. Although FIGS. 3 and 4 illustrate the first back electrode 24 overlapping the source electrode 7 in a plan view, the configuration is not limited thereto. For example, the first back electrode 24 may be formed so as to overlap the drain electrode 10 in a plan view.

As mentioned above, the third diode 42 and the fourth diode 43, which rectify the current in reverse directions, constitute a bidirectional diode. The gate wire 4 and the short ring wire 23 are connected with each other through the bidirectional diode.

Thus, the configuration in the first preferred embodiment provides electrical connection between the short ring wire 22 and the short ring wire 23 mentioned above, thereby avoiding electrostatic breakdown or the threshold voltage shift in the transistors. In the non-linear element, each diode is formed of the first back electrode 24, the source electrode 7, and the drain electrode 10, as mentioned above. The gate capacitance is thus dependent on the film thickness and the film quality of the second insulation film 11 and the third insulation film 12. The third insulation film 12 is an organic insulation film having a low dielectric constant and a film thickness of 1 μm or more, with reduced gate capacitance. This configuration thus offers high diode resistance. The first back electrode 24 is not located over part of the oxide semiconductor film 31 sandwiched between the source electrode 7 and the drain electrode 10. Thus, the part of oxide semiconductor film 31 which is not covered with the first back electrode 24 functions as a resistor instead of functioning as a diode. In the non-linear element, each diode is connected with the resistor in series, thereby offering higher forward resistance. This configuration can accordingly reduce the size of the non-linear element and the area occupied by the non-linear element outside the display area, so that an array substrate with a narrow frame can be provided. In addition, the organic insulation film produces planarization effects, which enhance withstand voltage between the first back electrode 24 and the electrodes including the source electrode 7 and the drain electrode 10 and improve manufacturing yield accordingly.

Meanwhile, in the case where the non-linear element according to the first preferred embodiment includes a semiconductor layer made of amorphous silicon, the diode resistance becomes extraordinarily high because the amorphous silicon has an extremely low mobility and the gate insulation film has a low dielectric constant. When a surge electric field is applied, a current fails to escape to the short ring through the diode, causing electrical breakdown between the gate and the source. Thus, the use of amorphous silicon is less suitable for the above-mentioned structure of the non-linear element according to the first preferred embodiment. A workaround to this problem is to reduce the channel length (L). In this case, however, a resist is not probably patterned properly in the photolithography process, resulting in poor yields. Increasing the channel width may be another workaround but causes upsizing of diode.

The connection between the short ring wire 22 and the short ring wire 23 may be established by the third conductive film through a contact hole (not shown) of an upper-layer insulation film (not shown) or may be established by the bidirectional diode.

In the first preferred embodiment, the oxide semiconductor film 31 is, for example, an oxide semiconductor based on zinc oxide (ZnO), an InZnSnO-based oxide obtained by adding indium oxide ($In_2O_3$) and tin oxide ($SnO_2$) to zinc oxide (ZnO), or InGaZnO-based semiconductor obtained by adding gallium oxide ($Ga_2O_3$) and indium oxide ($In_2O_3$) to zinc oxide (ZnO). The carrier concentration of the oxide semiconductor film 31 is desirably adjusted to be equal to or smaller than $1E+12/cm^3$.

In actuality, the gate wire 4 and the light-shielding body 30 do not function as the gate electrode in diode element portions (the first diode 40, the second diode 41, the third diode 42, and the fourth diode 43). The light-shielding body 30 may be eliminated. However, the carrier concentration of the oxide semiconductor film 31 increases in response to the radiation of light, and thus, it is preferred that the light-shielding body 30 be provided for better control of the diode resistance.

Second Preferred Embodiment

The following will describe another configuration of the non-linear element (the bidirectional diode) connected to the source wire.

Figure 5:
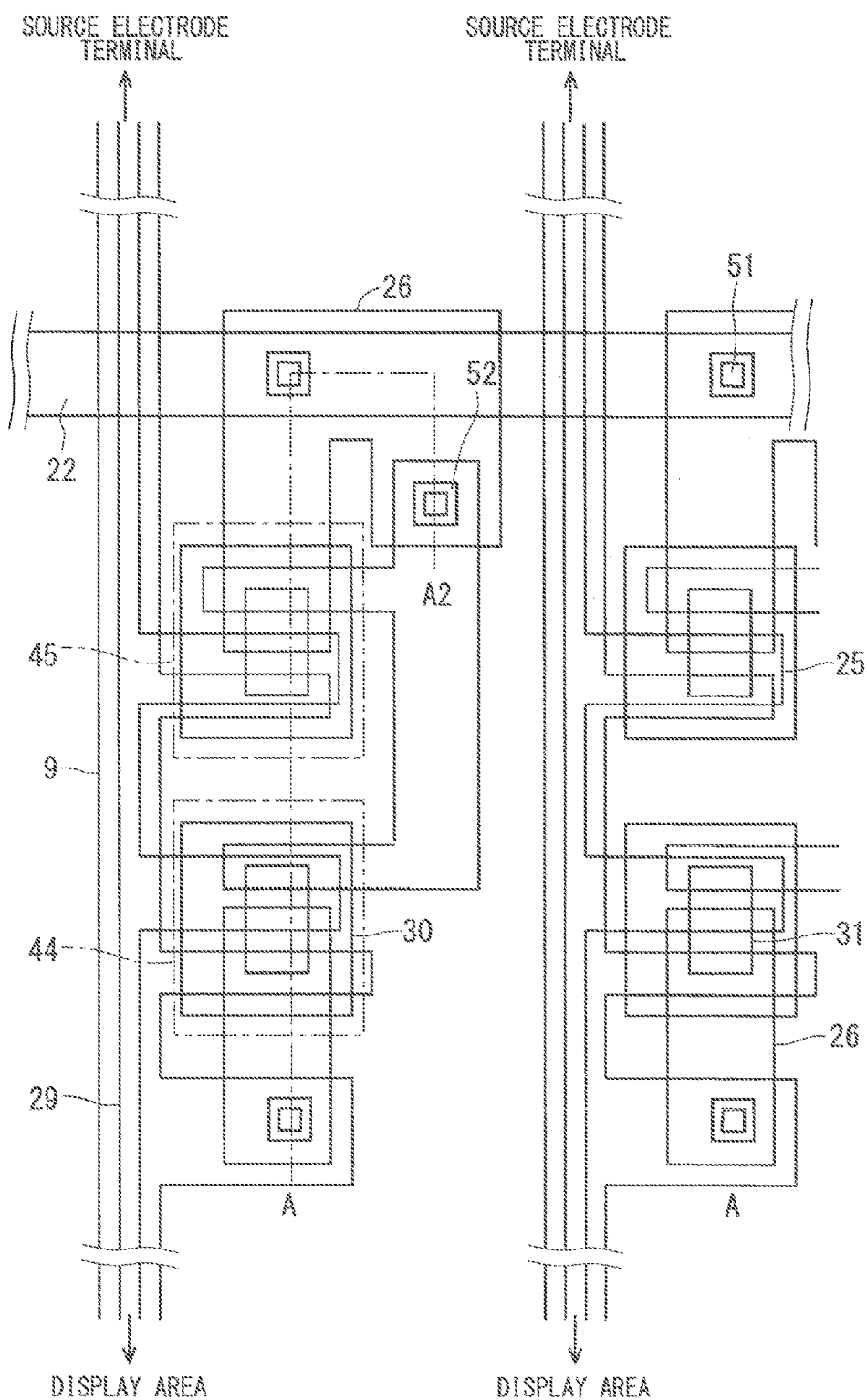
FIG. 5 is a plan view of an example configuration of the non-linear element adjacent to the source wire according to a second preferred embodiment of the present invention.
Figure 6:
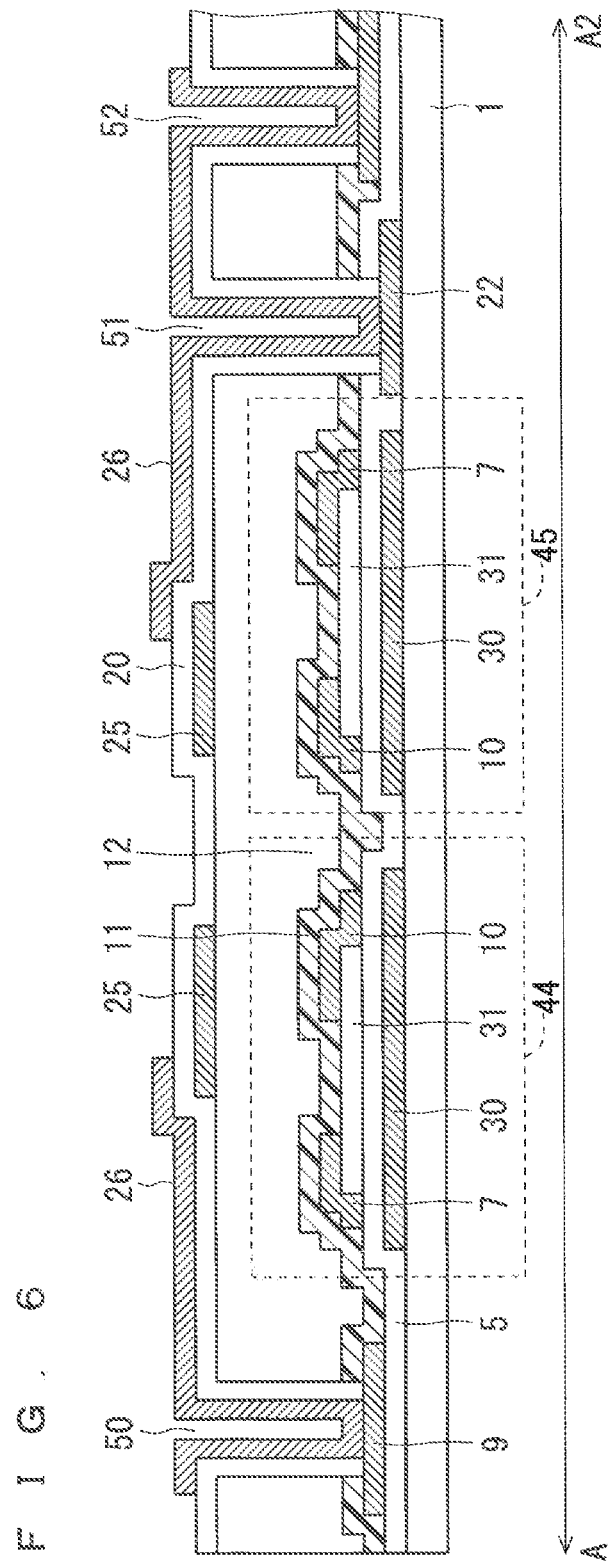
FIG. 6 is a cross-sectional view taken along the line A-A2 of FIG. 5.

FIG. 5 is a plan view of an example configuration of the bidirectional diode adjacent to the source wire according to a second preferred embodiment of the present invention. FIG. 6 is a cross-sectional view taken along the line A-A2 of FIG. 5.

As illustrated in FIGS. 5 and 6, the light-shielding body 30 and the short ring wire 22, which are formed by processing the first conductive film made of metal or the like, are located on the substrate 1 that is a transparent insulation substrate made of, for example, glass. Here, the first conductive film is used to form a low-resistance wire that is to be formed into the short ring wire 22. Alternatively, the low-resistance wire may be formed of the second conductive film, which will be described below.

The first insulation film 5 is formed so as to cover the light-shielding body 30 and the short ring wire 22. The oxide semiconductor film 31 is formed on the first insulation film 5 so as to overlap the light-shielding body 30 in a plan view. The oxide semiconductor film 31 lies inboard with respect to the light-shielding body 30 in a plan view.

The source electrode 7 and the drain electrode 10 that are formed of the second conductive film are apart from each other on the oxide semiconductor film 31. The oxide semiconductor films 31, each of which is located between the source electrode 7 and the drain electrode 10, function as channels of a fifth diode 44 and a sixth diode 45. The second conductive film is formed into the source electrode terminal (not shown) and the source wire 9, and extends across the display area.

The second insulation film 11 is formed so as to cover the first insulation film 5, the source electrode 7, the source wire 9, the drain electrode 10, and the oxide semiconductor film 31. The third insulation film 12 is formed so as to cover the second insulation film 11. The second insulation film 11 may be an inorganic insulation film, whereas the third insulation film 12 may be an organic insulation film having planarization properties.

Provided on the third insulation film 12 is a common wire 29 (a common potential wire) formed of the third conductive film. The common wire 29 extends toward the channels of the fifth diode 44 and the sixth diode 45, where a second back electrode 25 (a second back electrode) is provided. Thus, a common potential is applied to the second back electrode 25. The second back electrode 25 is formed so as to overlap the drain electrode 10 of each of the fifth diode 44 and the sixth diode 45 in a plan view and to overlap part of the oxide semiconductor film 31 in a plan view.

The second back electrode 25 and the third insulation film 12 are covered with a fourth insulation film 20 (a third insulation film). Provided on the fourth insulation film 20 is a third back electrode 26 formed of a fourth conductive film. The third back electrode 26 adjacent to the fifth diode 44 is electrically connected to the source wire 9 through a seventh contact hole 50. The third back electrode 26 adjacent to the sixth diode 45 is electrically connected to the short ring wire 22 through an eighth contact hole 51 and is electrically connected to the source electrode 7 of the sixth diode 45 through a ninth contact hole 52. The drain electrode 10 of the fifth diode 44 is integral with the source electrode 7 of the sixth diode 45 (these electrodes serve as one electrode). The third back electrode 26 is formed so as to overlap the source electrode 7 of each of the fifth diode 44 and the sixth diode 45 in a plan view and to overlap part of the oxide semiconductor film 31 in a plan view.

The following will describe a configuration of the non-linear element (the bidirectional diode) connected to the gate wire.

Figure 7:
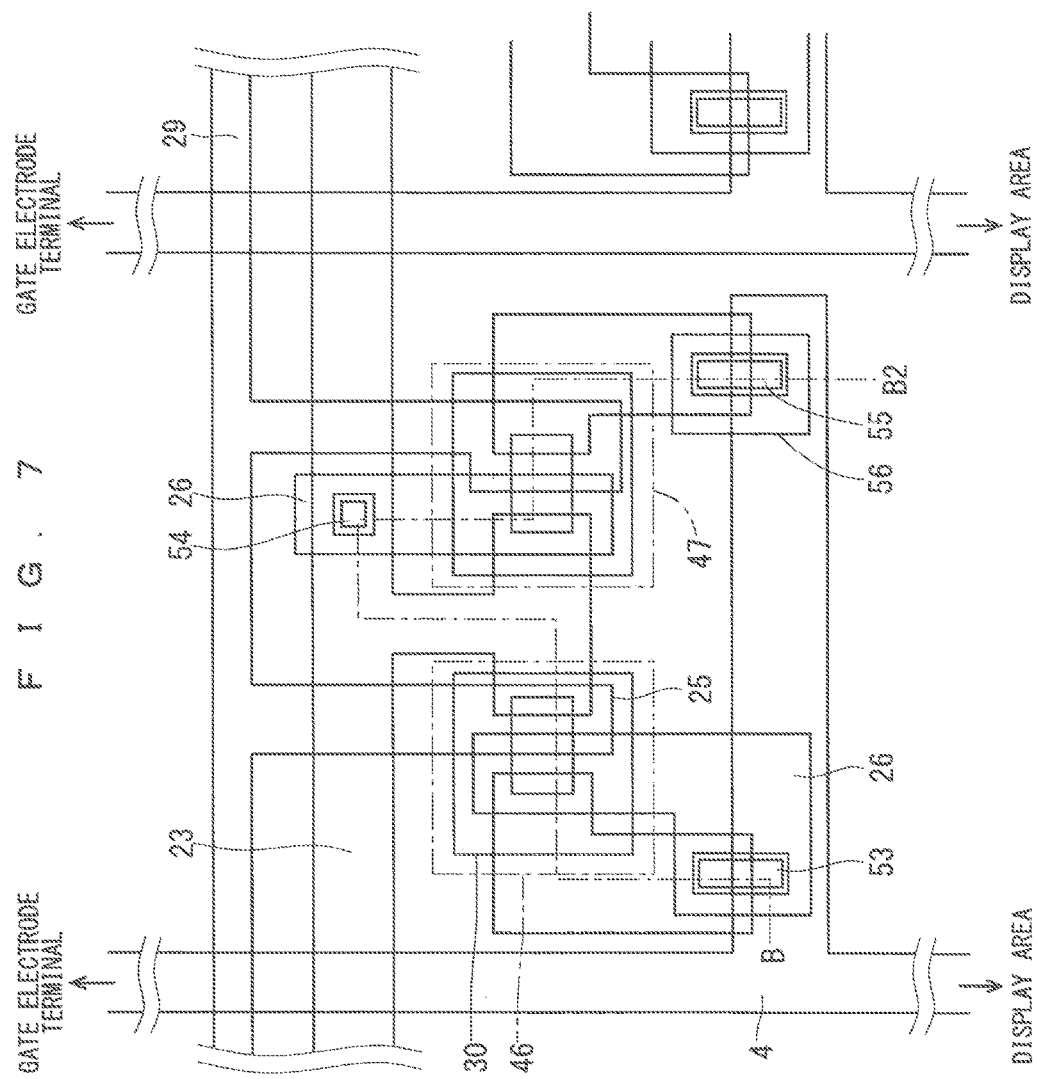
FIG. 7 is a plan view of an example configuration of the non-linear element adjacent to the gate wire according to the second preferred embodiment of the present invention.
Figure 8:
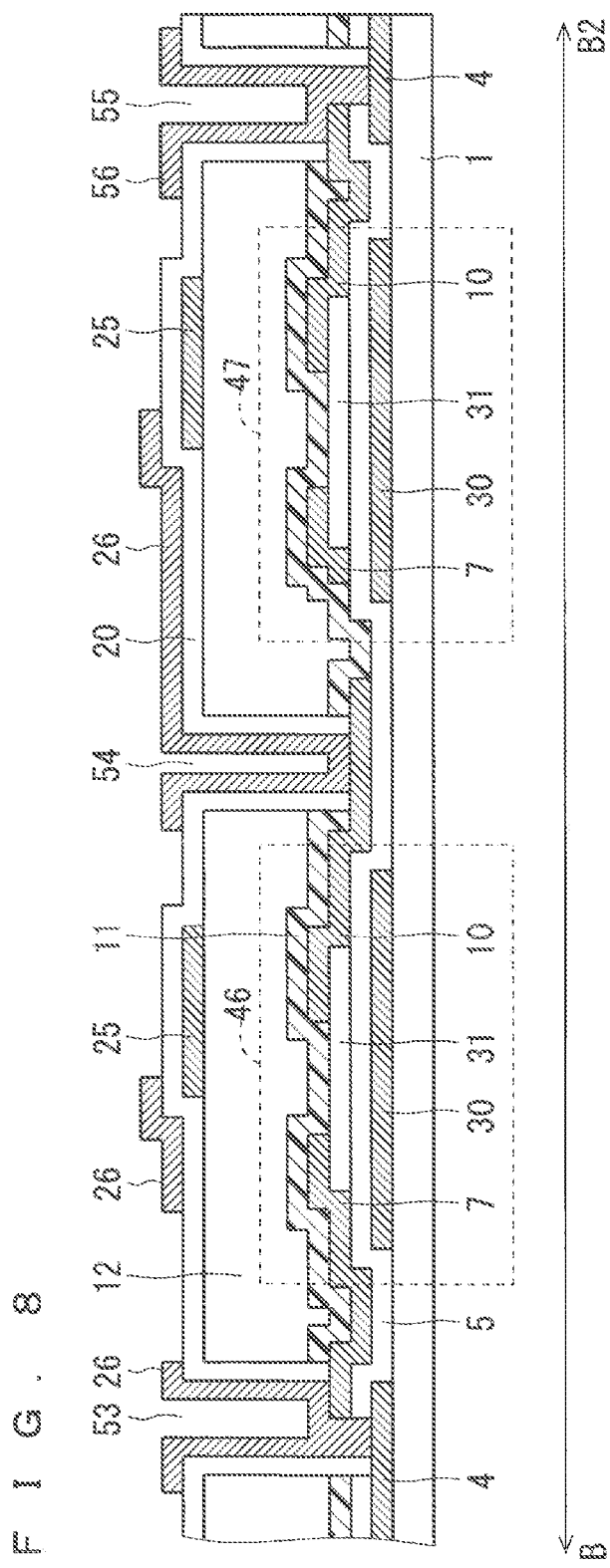
FIG. 8 is a cross-sectional view taken along the line B-B2 of FIG. 7.

FIG. 7 is a plan view of an example configuration of the bidirectional diode adjacent to the gate wire according to the second preferred embodiment. FIG. 8 is a cross-sectional view taken along the line B-B2 of FIG. 7.

As illustrated in FIGS. 7 and 8, the light-shielding body 30 and the gate wire 4 that are formed of the first conductive film are located on the substrate 1. The gate wire 4 extends over the display area. In addition, the gate electrode terminal (not shown) formed of the first conductive film is located on the substrate 1.

The first insulation film 5 is formed so as to cover the light-shielding body 30, the gate wire 4, and the gate electrode terminal. The oxide semiconductor film 31 is formed on the first insulation film 5 so as to overlap the light-shielding body 30 in a plan view. The oxide semiconductor film 31 lies inboard with respect to the light-shielding body 30 in a plan view.

The source electrode 7 and the drain electrode 10 that are formed of the second conductive film are apart from each other on the oxide semiconductor film 31. The oxide semiconductor films 31, each of which is located between the source electrode 7 and the drain electrode 10, function as channels of a seventh diode 46 and an eighth diode 47. In addition, the short ring wire 23 is formed.

The second insulation film 11 is formed so as to cover the first insulation film 5, the source electrode 7, the drain electrode 10, and the oxide semiconductor film 31. The third insulation film 12 is formed so as to cover the second insulation film 11. The second insulation film 11 may be an inorganic insulation film, whereas the third insulation film 12 may be an organic insulation film having planarization properties.

The common wire 29 formed of the third conductive film is located on the third insulation film 12. The common wire 29 extends toward the channels of the seventh diode 46 and the eighth diode 47, where the second back electrode 25 is formed. The second back electrode 25 is formed so as to overlap the drain electrode 10 of each of the seventh diode 46 and the eighth diode 47 in a plan view and to overlap part of the oxide semiconductor film 31 in a plan view.

The fourth insulation film 20 is formed so as to cover the second back electrode and the third insulation film 12. Provided on the fourth insulation film 20 is the third back electrode 26 and a connection wire 56, which are formed of the fourth conductive film. The third back electrode 26 adjacent to the seventh diode 46 is electrically connected to the gate wire 4 and the source electrode 7 of the seventh diode 46 through a tenth contact hole 53. The third back electrode 26 adjacent to the eighth diode 47 is electrically connected to the short ring wire 23 through an eleventh contact hole 54. The connection wire 56 is electrically connected to both the drain electrode 10 of the eighth diode 47 and the gate wire 4 through a twelfth contact hole 55. The drain electrode 10 of the seventh diode 46 is integral with the source electrode 7 of the eighth diode 47 (through the short ring wire 23). The third back electrode 26 is formed so as to overlap the source electrode 7 of each of the seventh diode 46 and the eighth diode 47 in a plan view and to overlap part of the oxide semiconductor film 31 in a plan view.

Thus, the configuration in the second preferred embodiment provides electrical connection between the short ring wire 22 and the short ring wire 23 mentioned above, thereby avoiding electrostatic breakdown or the threshold voltage shift in the transistors.

The configuration in which part of the oxide semiconductor film 31 is covered with the second back electrode 25 connected to the common wire 29 can further reduce the size of the individual TFT. A voltage (a voltage of about 4 to 6 V) lower than the maximum operating voltage of the source wire 9 is applied across the common wire 29. In the case where the second back electrode 25 is located below the third back electrode 26 (the third back electrode 26 and the second back electrode 25 partially overlap each other in a plan view), the maximum operating voltage, which may be applied to the third back electrode 26, is not applied to part of the back channel in which the second back electrode 25 and the third back electrode 26 overlap each other in a plan view. The diode with a shorter channel length has a low resistance accordingly.

The carrier concentration of the oxide semiconductor film 31 varies due to plasma damage or the intrusion of hydrogen in the manufacturing process, and thus, the resistance value of the oxide semiconductor film 31 is unsettled. The resistance can be controlled more easily in the second preferred embodiment in which a non-liner element as a whole has a diode structure than in the first preferred embodiment in which a non-linear element includes the diode portion and the resistor that are connected in series. Such a non-linear element has stable properties, which can provide an improvement in yield.

Third Preferred Embodiment

The following will describe a third preferred embodiment of the present invention, in which the non-linear element (the bidirectional diode) in the second preferred embodiment is applied to an array substrate for the FFS mode (hereinafter referred to as an "FFS" array substrate). The bidirectional diode according to the second preferred embodiment is highly compatible with the FFS array substrate. The second electrode 25, the third back electrode 26, and a liquid crystal driving electrode (the pixel electrode or the common electrode) on the FFS array substrate can be formed as one layer and can be formed of the same material. The liquid crystal driving electrode is located on an organic insulation film, and thus, the FFS array substrate can achieve high aperture ratio. On such an FFS array substrate, a protection circuit including the back electrodes can be formed, with no additional process.

Figure 12:
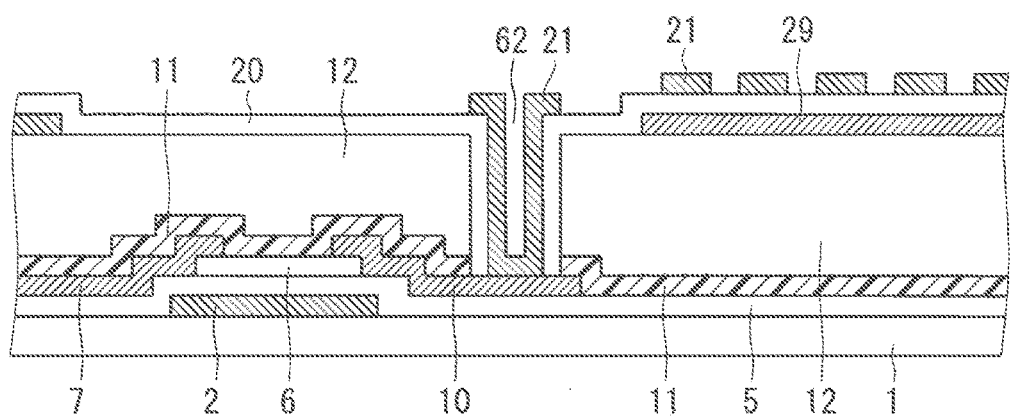
FIG. 12 is a cross-sectional view taken along the line C-C2 of FIG. 9.

FIG. 9 is a plan view of an example configuration of an FFS array substrate according to the third preferred embodiment. FIG. 10 is a cross-sectional view taken along the line E-E2 of FIG. 9. FIG. 11 is a cross-sectional view taken along the line D-D2 of FIG. 9. FIG. 12 is a cross-sectional view taken along the line C-C2 of FIG. 9.

Specifically, FIG. 9 illustrates a pixel portion (an area in which pixels are formed) in the display area of the FFS array substrate and also illustrates a gate terminal portion and a source terminal portion that are located outside the display area. The portion through which the line C-C2 of FIG. 9 runs is the pixel portion. The portion through which the line D-D2 of FIG. 9 runs is an area (the gate terminal portion) occupied by a gate electrode terminal 3 and a gate terminal pad 63 that are formed to provide a gate signal to the gate wire 4 (not shown in FIG. 9) through the non-linear element illustrated in FIGS. 7 and 8. The portion through which the line E-E2 of FIG. 9 runs is an area (the source terminal portion) occupied by a source electrode terminal 8 and a source terminal pad 64 that are formed to apply a display signal to the source wire 9 (not shown in FIG. 9) through the non-linear element illustrated in FIGS. 5 and 6.

As illustrated in FIGS. 9 to 12, the gate wire 4, the short ring wire 22, the light-shielding body 30, a gate electrode 2, and the gate electrode terminal 3, which are formed by processing the first conductive film made of metal or the like, are located on the substrate 1 that is a transparent insulation substrate made of, for example, glass.

The first insulation film 5 is formed so as to cover the gate wire 4, the short ring wire 22, the light-shielding body 30, the gate electrode 2, and the gate electrode terminal 3. As illustrated in FIGS. 9 and 12, the gate electrode 2 of the individual TFT is part of the gate wire 4 and is wider than the remaining part of the gate wire 4.

Provided on the first insulation film 5 is an oxide semiconductor film 6 that is formed so as to overlap the gate electrode 2 in a plan view. The oxide semiconductor film 6 lies inboard with respect to the gate electrode 2 in a plan view. The oxide semiconductor film 31 is formed on the first insulation film 5 so as to overlap the light-shielding body 30 in a plan view. The oxide semiconductor film 31 lies inboard with respect to the light-shielding body 30 in a plan view.

The source electrode 7 and the drain electrode 10 that are formed of the second conductive film are apart from each other on the oxide semiconductor films 6 and 31. The oxide semiconductor film 6 sandwiched between the source electrode 7 and the drain electrode 10 functions as the channel of the individual TFT. The oxide semiconductor film 31 sandwiched between the source electrode 7 and the drain electrode 10 functions as the channel of the individual diode. The second conductive film is formed into the source electrode terminal 8 and the source wire 9.

The second insulation film 11 is formed so as to cover the entire substrate. The third insulation film 12 is formed so as to cover the second insulation film 11. The second insulation film 11 may be an inorganic insulation film, whereas the third insulation film 12 may be an organic insulation film having planarization properties.

The common wire 29 formed of the third conductive film is located on the third insulation film 12. The common wire 29 extends toward the channels of the diodes, where the second back electrode 25 is formed. The second back electrode 25 is formed so as to overlap the drain electrode 10 of the individual diode in a plan view and to overlap part of the oxide semiconductor film 31 in a plan view. The common wire 29 also extends over the pixel portion in a manner to cover the pixel portion almost entirely. In the illustration of FIG. 9, no common wire 29 is provided in the TFT portion and around a thirteenth contact hole 60.

The fourth insulation film 20 is formed so as to cover the entire substrate. Provided on the fourth insulation film 20 are the third back electrode 26, a comb-teeth shaped electrode 21, the connection wire 56, the gate terminal pad 63, and the source terminal pad 64, which are formed of the fourth conductive film. The comb-teeth shaped electrode 21 is a pixel electrode formed in the pixel portion and is electrically connected to the drain electrode 10 through a fifteenth contact hole 62. The gate terminal pad 63 is electrically connected to the gate electrode terminal 3 through a fourteenth contact hole 61. The source terminal pad 64 is electrically connected to the source electrode terminal 8 through the thirteenth contact hole 60.

The following will describe a method for manufacturing an FFS array substrate according to the third preferred embodiment.

Firstly, the first conductive film is deposited on the substrate 1 that is a transparent insulation substrate made of glass. Here, the first conductive film, which is an aluminum (Al) alloy film (such as an Al—Ni—Nd film) having a thickness of 200 to 300 nm, is deposited by the DC magnetron sputtering. Then, a resist material is applied to the Al alloy film. In a first photolithography process, a photoresist pattern is formed, and then, the Al alloy film is etched, using the photoresist pattern as a mask. The Al film is accordingly patterned into the gate wire 4, the short ring wire 22, the light-shielding body 30, the gate electrode 2, and the gate electrode terminal 3 on the substrate 1.

Although the Al—Ni—Nd alloy was used in this preferred embodiment, any other material having a sufficiently low wiring resistance may be used. The Al—Ni—Nd alloy used in the third preferred embodiment is based on aluminum, thus being highly conductive. The Al—Ni—Nd alloy contains nickel (Ni), which can provide electrical bonding with a transparent conductive film made of, for example, indium tin oxide (ITO). The Al alloy film was etched with a known PAN etchant (mixed acid containing phosphoric acid, nitric acid, and acetic acid).

Next, the first insulation film 5 is deposited on the entire upper surface of the substrate 1. In the formation of the first insulation film 5 according to the third preferred embodiment, a silicon nitride (SiN) film having a thickness of 400 nm and a silicon oxide (SiO) film having a thickness of 50 nm were formed in the stated order by the chemical vapor deposition (CVD) method. The silicon oxide film has poor barrier properties to impurity elements such as moisture ($H_2O$), hydrogen ($H_2$), sodium (Na), and potassium (K), which may affect characteristics of TFTs. For this reason, the first insulation film 5 has a lamination structure in which the SiN film having excellent barrier properties is located below the SiO film. In addition, the first insulation film 5 functions as a gate insulation film.

Then, the oxide semiconductor films 6 and 31 are deposited on the first insulation film 5. In the third preferred embodiment, a film having a thickness of 50 nm was deposited by the DC magnetron sputtering, using an In—Zn—Sn—O target [$In_2O_3.(ZnO)_6.(SnO_2)_2$] with the atomic composition ratio of In:Zn:Sn:O=2:6:2:13. In a case where a film is deposited by sputtering using a known argon (Ar) gas, the film usually has an atomic composition ratio of oxygen that is smaller than the stoichiometry. Consequently, the resultant oxide film becomes deficient in oxygen ion (the composition ratio of O is less than 13 in the above example). Thus, an Ar gas mixed with oxygen gas is preferably used in sputtering. In this preferred embodiment, sputtering was performed, using an Ar gas containing a $O_2$ gas mixed at 5 to 10% by partial pressure ratio. Immediately after being deposited, the In—Zn—Sn—O film has an amorphous structure and is soluble in an etchant containing oxalic acid. Meanwhile, almost no film reduction is observed in the film that has been immersed in the PAN chemical solution for five minutes at a solution temperature of 20 to 40° C. This means that the film cannot be etched with the PAN chemical solution.

In a second photolithography process, a photoresist pattern is formed, and then, the oxide semiconductor films 6 and 31 are etched, using the photoresist pattern as a mask. These films may be wet-etched with a chemical solution containing oxalic acid. The chemical solution preferably contains 1 to 10 wt % oxalic acid. In the third preferred embodiment, the oxide semiconductor films 6 and 31 were etched with an oxalic acid-based chemical solution containing 5 wt % oxalic acid and water. Then, the photoresist pattern was removed and the entire substrate 1 underwent atmospheric annealing at 350° C. for 60 minutes in order to set the carrier concentration of the oxide semiconductor to $1E+12/cm^3$ or lower.

The oxide semiconductor films can be supplied with a greater amount of oxygen through annealing in the presence of oxygen, so that the carrier concentration of the films can be adjusted. The annealing also induces structural relaxation, which can reduce structural defects to improve the quality of the semiconductor films. Although the atmospheric annealing has been described, annealing may be carried out in an atmosphere of steam or in an atmosphere of a mixture of an oxygen gas and a nitrogen gas in a certain ratio that have been supplied from gas cylinders. Alternatively, the substrate may be optically annealed with ultraviolet (ULV) rays in the state in which ozone having strong oxidizing power is generated.

Then, the second conductive film, which may be made of a molybdenum (Mo) alloy, chromium (Cr), an Al alloy (such as Al—Ni—Nd), and the like, is deposited by the DC magnetron sputtering. In the third preferred embodiment, a MoNb alloy film having a thickness of 100 nm and an Al—Ni—Nd alloy film having a thickness of 100 nm were deposited in the stated order to form a lamination structure. In a third photolithography process, a photoresist pattern is formed, and then, the laminated film including the Al alloy film and the Mo alloy film is etched, using the photoresist pattern as a mask. The laminated film is formed into the source electrode 7 and the drain electrode 10 by the etching. In addition, the source electrode terminal 8 and the source wire 9 are formed simultaneously. The laminated film may be wet-etched with a solution (a PAN chemical solution) containing phosphoric acid, acetic acid, and nitric acid. In the this preferred embodiment, the laminated film was etched with a PAN chemical solution containing 70 wt % phosphoric acid, 7 wt % acetic acid, 5 wt % nitric acid, and water.

Next, the photoresist pattern is removed and atmospheric annealing is performed at 300° C. for 60 minutes. In general, an oxide semiconductor film suffers etching damage and property degradation caused by not only oxalic acid but also an acid solution commonly used to etch a metal film (made of Cr, Mo, tantalum (Ta), Al, copper (Cu), or an alloy of these metals) in the formation of a source electrode and a drain electrode of a TFT. The carrier concentration increases with increasing oxygen deficiencies, so that the semiconductor film is required to undergo oxidation again. In the third preferred embodiment, atmospheric annealing was performed for oxidation. Alternatively, above-mentioned types of annealing may be performed.

Then, the second insulation film 11 is deposited so as to cover the entire substrate. In the third preferred embodiment, the second insulation film being a silicon oxide (SiO) film having a thickness of 200 nm was deposited by the chemical vapor deposition (CVD) method. Subsequently, the third insulation film 12, which is an organic insulation film having planarization properties, is formed. In the third preferred embodiment, an acrylic organic resin material having photosensitivity was applied to form a film with a thickness of 2.0 to 3.0 μm by spin coating. Although the acrylic organic resin material was used in the third preferred embodiment mentioned above, the material for use in this process may be based on olefin, novolac, polyimide, or siloxane.

The photosensitive organic resin material is patterned in a fourth photolithography process and undergoes a development process for removing the organic material located on the positions corresponding to the seventh contact hole 50, the eighth contact hole 51, the ninth contact hole 52, the tenth contact hole 53, the eleventh contact hole 54, the twelfth contact hole 55, the thirteenth contact hole 60, the fourteenth contact hole 61, and the fifteenth contact hole 62. Subsequently, the organic resin material is baked to sinter in the atmosphere at 200 to 230° C. for 60 minutes. The organic resin material that has undergone the baking becomes an insulation film with increased resistance to pressure and high strength. Thus, the third insulation film 12 can be used as a mask in the following dry etching.

The first insulation film 5 and the second insulation film 11 are dry-etched, using the third insulation film 12 as a mask, to form the seventh contact hole 50, the eighth contact hole 51, the ninth contact hole 52, the tenth contact hole 53, the eleventh contact hole 54, the twelfth contact hole 55, the thirteenth contact hole 60, the fourteenth contact hole 61, and the fifteenth contact hole 62. In the third preferred embodiment, dry etching was performed, using a mixed gas obtained by adding oxygen ($O_2$) to sulfur hexafluoride (SF6).

Then, an ITO film, which a transparent conductive film, is deposited by the DC magnetron sputtering to form the third conductive film having a thickness of 50 to 80 nm. A mixture of an Ar gas and moisture is used as a sputtering gas. The transparent conductive film is patterned in a fifth photolithography process and is wet-etched to form the common wire 29. The common wire 29 extends toward the channels of the diodes, where the second back electrode 25 is provided. The common wire 29 also extends over the pixel portion in a manner to cover the pixel portion almost entirely. In the illustration of FIG. 9, no common wire 29 is located in the TFT portion and around the thirteenth contact hole 60. Alternatively, the common wire may be located above the TFT. A common potential is applied to the common wire 29 from the outside (not shown).

Then, the fourth insulation film 20 is deposited so as to cover the entire substrate. In the third preferred embodiment, a silicon nitride (SiN) film having a thickness of 300 to 400 nm was deposited by the chemical vapor deposition (CVD) method. In a sixth photolithography process, contact holes are formed in the photoresist in a manner to correspond to the positions of the seventh contact hole 50, the eighth contact hole 51, the ninth contact hole 52, the tenth contact hole 53, the eleventh contact hole 54, the twelfth contact hole 55, the thirteenth contact hole 60, the fourteenth contact hole 61, and the fifteenth contact hole 62. The fourth insulation film 20 located in these contact holes are etched to be removed, using the photoresist pattern as a mask. The diameters of the contact holes formed in the photoresist in the sixth photolithography process are small enough to fit in the existing contact holes.

Then, the forth conductive film is deposited. In the third preferred embodiment, an amorphous ITO film was deposited as in the formation of the third conductive film. Subsequently, a photoresist pattern is formed in a seventh photolithography process and the amorphous ITO film is etched, using the photoresist pattern as a mask. In this preferred embodiment, the ITO film was wet-etched with an oxalic acid-based chemical solution containing 5 wt % oxalic acid and water. The photoresist pattern is subsequently removed. The third back electrode 26, the comb-teeth shaped electrode 21, the connection wire 56, the gate terminal pad 63, and the source terminal pad 64 are formed accordingly.

The comb-teeth shaped electrode 21 is electrically connected to the drain electrode 10 through the fifteenth contact hole 62. The gate terminal pad 63 is electrically connected to the gate electrode terminal 3 through the fourteenth contact hole 61. The source terminal pad 64 is electrically connected to the source electrode terminal 8 through the thirteenth contact hole 60. The third back electrode 26 adjacent to the sixth diode 45 is electrically connected to the short ring wire 22 through the eighth contact hole 51 and is also electrically connected to the source electrode 7 of the sixth diode 45 through the ninth contact hole 52. The third back electrode 26 adjacent to the fifth diode 44 is electrically connected to the source wire 9 through the seventh contact hole 50. The third back electrode 26 adjacent to the seventh diode 46 is electrically connected to the gate wire 4 and the source electrode 7 of the seventh diode 46 through the tenth contact hole 53. The third back electrode 26 adjacent to the eighth diode 47 is electrically connected to the short ring wire 23 through the eleventh contact hole 54. The connection wire 56 is electrically connected to the gate wire 4 and the drain electrode of the eighth diode 47 through the twelfth contact hole 55.

A thermal treatment is subsequently performed in the atmosphere at 230° C. for 60 minutes in order to eliminate, for example, plasma damage inflicted on the array substrate during the manufacturing process.

For the assembly of a liquid crystal display panel, an alignment film or a spacer is formed on the surface of the TFT substrate (the array substrate) completed through the above-mentioned processes. The alignment film is a film used to align liquid crystals and is made of, for example, polyimide. The array substrate is bonded to a separately produced counter substrate including a color filter or an alignment film. The spacer provides a gap between the TFT substrate and the counter substrate. A liquid crystal layer is formed and sealed in the gap, so that a liquid crystal display panel employing the FFS mode is formed. Finally, a polarization plate, a phase difference plate, a backlight unit, and the like are provided on the outer side of the liquid crystal panel, so that a liquid crystal display is completed.

As mentioned above, the second back electrode 25, the third back electrode 26, and the liquid crystal driving electrode (the pixel electrode or the common electrode) on the FFS array substrate are formed as one layer and are formed of the same material in the third preferred embodiment. The light-shielding body 30, the gate electrode 2 included in the pixel transistor in the pixel portion of the array substrate, and a gate wire 4 are formed of the same material, namely, the first conductive film. The insulation film formed on the light-shielding body 30 and the gate insulation film included in the pixel transistor are formed of the same material, namely, the first insulation film 5. Thus, the protection circuit (the bidirectional diode) is formed, with no additional processes.

In other preferred embodiments, such a protection circuit may be formed on the array substrate that includes the pixel portion having an array pattern, as in the third preferred embodiment. In this case, the light-shielding body 30 and either the gate wire 4 or the gate electrode 2 included in the pixel transistor located in the pixel portion of the array element substrate are formed of the same material, namely, the first conductive film. The insulation film disposed so as to cover the light-shielding body 30 and the gate insulation film of the pixel transistor are formed of the same material, namely, the first insulation film 5. Thus, the protection circuit is formed, with no additional processes.

In the above description, the bidirectional diode according to the second preferred embodiment has been applied to the FFS array substrate. Alternatively, the bidirectional diode according to the first preferred embodiment may be applied to the FFS array substrate. In this case as well, such a protection circuit (a bidirectional diode) is formed, with no additional processes.

Fourth Preferred Embodiment

As mentioned above, the oxide semiconductor film suffers etching damage caused by an acid solution commonly used to etch a metal film (made of Cr, titanium (Ti), Mo, Ta Al, Cu or an alloy of these metals) in the formation of the source electrode and the drain electrode of the TFT. When the source electrode 7 and the drain electrode 10 are formed on the oxide semiconductor films 6 and 31 by etching, the surfaces of the oxide semiconductor films 6 and 31 (the channels) between the source electrode 7 and the drain electrode 10 become more and more deficient in oxygen, causing a surge in carrier concentration. In order to minimize the increase in carrier concentration, annealing is performed in the atmosphere containing oxygen. However, the carrier concentration variably increases according to the type of the metal that is in contact with the oxide semiconductor films 6 and 31 or the temperature of a solution used in etching. If oxidation is insufficient, the TFT would fail to turn off properly and the resistance of the non-linear element would decrease, causing a leakage current. If oxidation is excessive, the carrier concentration of the TFT would decrease, and the on-state current and the mobility would decrease accordingly. These problems are solved by a fourth preferred embodiment of the present invention, which will be described below.

Figure 13:
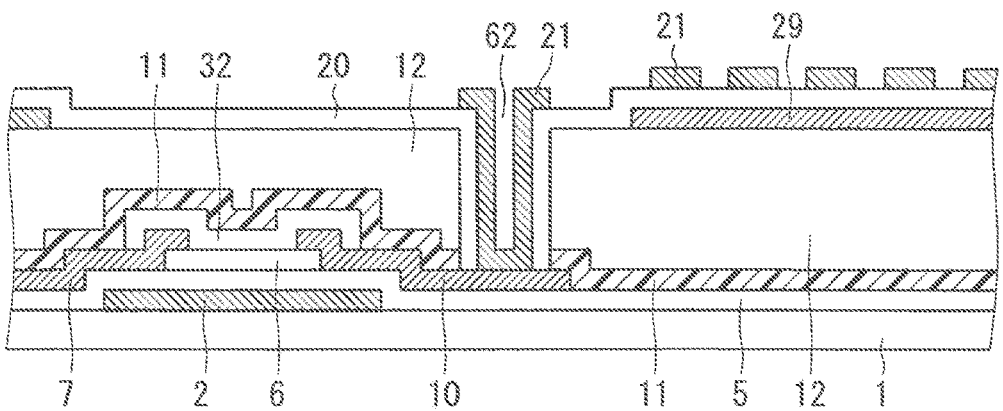
FIG. 13 is a cross-sectional view taken along the line C-C2 of FIG. 9 according to a fourth preferred embodiment of the present invention.
Figure 14:
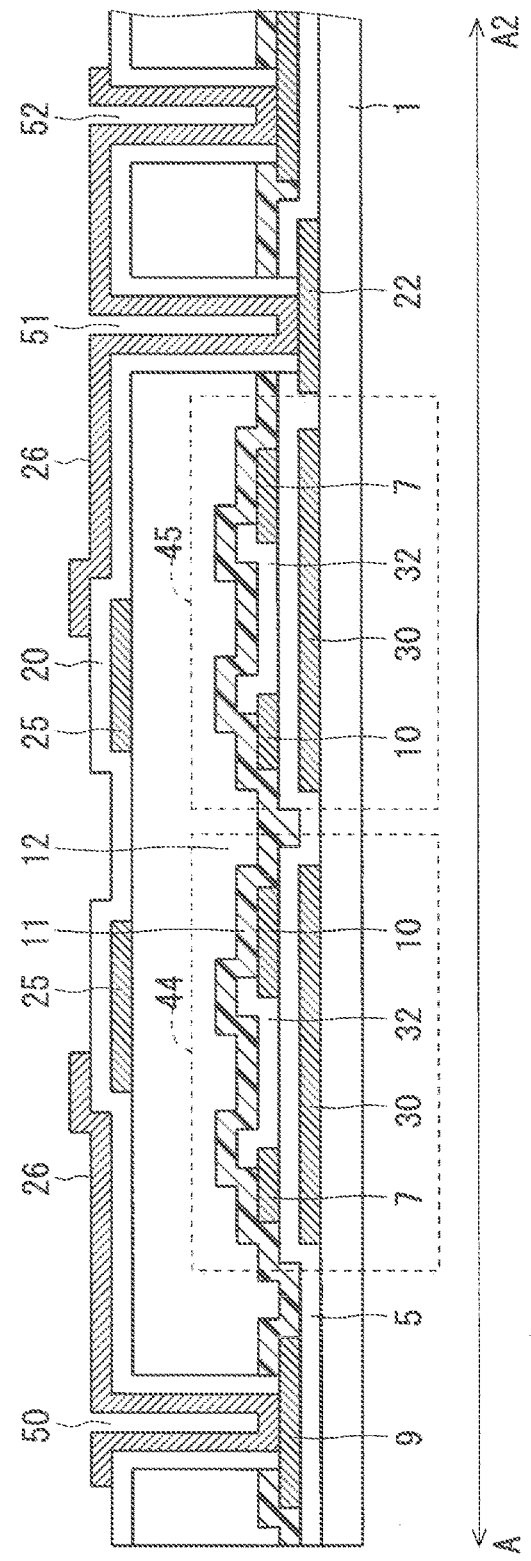
FIG. 14 is a cross-sectional view taken along the line A-A2 of FIG. 5 according to the fourth preferred embodiment of the present invention.
Figure 15:
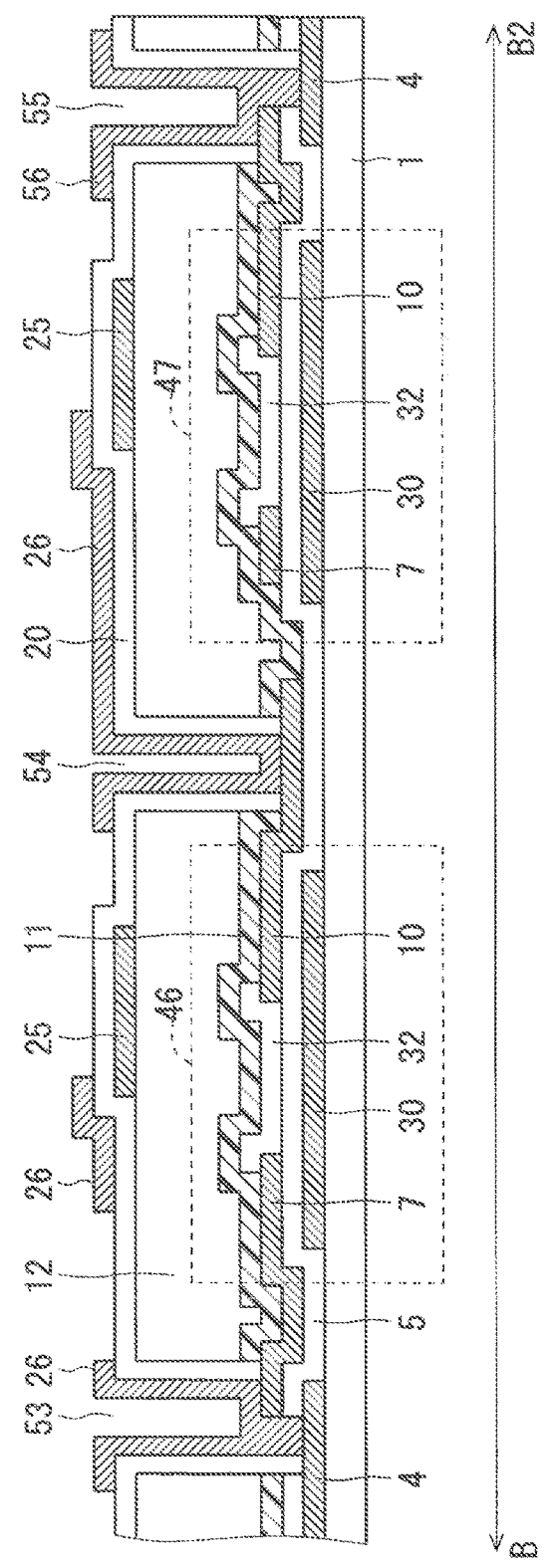
FIG. 15 is a cross-sectional view taken along the line B-B2 of FIG. 7 according to the fourth preferred embodiment of the present invention.

FIG. 13 is a cross-sectional view of the pixel portion included in the display area of the FFS array substrate according to the fourth preferred embodiment and is a cross-sectional view taken along the line C-C2 of FIG. 9. FIG. 14 is a cross-sectional view of an example configuration of the bidirectional diode adjacent to the source wire. The plan view of this example configuration is similar to FIG. 5. FIG. 15 is a cross-sectional view of an example configuration of the bidirectional diode adjacent to the gate wire. The plan view of this example configuration is similar to FIG. 7.

The portion through which the line D-D2 of FIG. 9 runs is an area (the gate terminal portion) occupied by the gate electrode terminal 3 and the gate terminal pad 63 that are formed to provide a gate signal to the gate wire 4 through the non-linear element illustrated in FIG. 15. The portion through which the line E-E2 of FIG. 9 runs is an area (the source terminal portion) occupied by the source electrode terminal 8 and the source terminal pad 64 that are formed to apply a display signal to the source wire 9 through the non-linear element illustrated in FIG. 14.

The following description will be focused on differences between the configuration of the FFS array substrate according to the fourth preferred embodiment and the configuration of the FFS array substrate according to the third preferred embodiment.

As illustrated in FIG. 13, provided in the pixel portion is a second oxide semiconductor film 32, which is formed so as to extend from part of the source electrode 7, through the oxide semiconductor film 6, and to part of the drain electrode 10. The oxygen concentration is higher and the carrier concentration is lower in the second oxide semiconductor film 32 than in the oxide semiconductor film 6. In the area other than the pixel portion, namely, the area occupied by the non-linear element, the second oxide semiconductor film 32 is formed, as illustrated in FIGS. 14 and 15, so as to extend from part of the source electrode 7, through the first insulation film 5, and to part of the drain electrode 10.

The following will describe a method for manufacturing an FFS array substrate according to the fourth preferred embodiment. A series of processes will be performed as in the third preferred embodiment until the first insulation film 5 is formed, and will not be further elaborated here.

The oxide semiconductor film 6 (a second oxide semiconductor film) is deposited on the first insulation film 5. In the fourth preferred embodiment, a film having a thickness of 50 nm was deposited by the DC magnetron sputtering, using an In—Zn—Sn—O target [In$_2$O$_3$—(ZnO)$_6$.(SnO$_2$)$_2$] with the atomic composition ratio of In:Zn:Sn:O=2:6:2:13. In this preferred embodiment, sputtering was performed, using an Ar gas containing a O$_2$ gas mixed at 5 to 10% by partial pressure ratio.

Then, a photoresist pattern is formed in a photolithography process and an oxide semiconductor film is etched, using the photoresist pattern as a mask. The oxide semiconductor film may be wet-etched, using a chemical solution containing oxalic acid. Subsequently, the photoresist pattern is removed, and then, the substrate undergoes atmospheric annealing at 350° C. for 60 minutes such that the oxide semiconductor has a carrier concentration of 1E+12/cm$^3$ or lower.

Then, the second conductive film, which may be made of a Mo alloy, chromium (Cr), an Al alloy (such as Al—Ni—Nd), or the like, is deposited by the DC magnetron sputtering. In the fourth preferred embodiment, a MoNb alloy film having a thickness of 100 nm and an Al—Ni—Nd alloy film having a thickness of 100 nm were deposited in the stated order to form a lamination structure. In a photolithography process, a photoresist pattern is formed, and then, the laminated film including the Al alloy film and the Mo alloy film is etched, using the photoresist pattern as a mask. The laminated film is formed into the source electrode 7 (a second source electrode) and the drain electrode 10 (a second drain electrode) by the etching. In addition, the source electrode terminal 8 and the source wire 9 are formed simultaneously. The laminated film may be wet-etched with a solution (a PAN chemical solution) containing phosphoric acid, acetic acid, and nitric acid. In this preferred embodiment, the laminated film was etched with a PAN chemical solution containing 70 wt % phosphoric acid, 7 wt % acetic acid, 5 wt % nitric acid, and water.

Then, the second oxide semiconductor film 32 (a third oxide semiconductor film) is deposited on the source electrode 7 and the drain electrode 10. In the fourth preferred embodiment, a film having a thickness of 50 nm was deposited by the DC magnetron sputtering, using an In—Zn—Sn—O target [In$_2$O$_3$—(ZnO)$_6$.(SnO$_2$)$_2$] with the atomic composition ratio of In:Zn:Sn:O=2:6:2:13. In this preferred embodiment, sputtering was performed, using an Ar gas containing a O$_2$ gas mixed at 20% by partial pressure ratio. The partial pressure of O$_2$ may be increased such that the oxygen concentration becomes higher in the second oxide semiconductor film 32 than in the oxide semiconductor film 6.

In a photolithography process, a photoresist pattern is formed in such a manner that the second oxide semiconductor film 32 becomes larger than the oxide semiconductor film 6, and then, the second oxide semiconductor film 32 is etched with oxalic acid, using the photoresist pattern as a mask. Consequently, the surface of the oxide semiconductor film 6 that is covered with neither the source electrode 7 nor the drain electrode 10 is covered with the second oxide semiconductor film 32.

Subsequently, the photoresist pattern is removed and the entire substrate 1 undergoes atmospheric annealing at 350° C. for 60 minutes such that the second oxide semiconductor film 32 has a carrier concentration of 1E+10/cm$^3$ or lower. In this annealing, oxygen is transferred from the second oxide semiconductor film 32 to the oxide semiconductor film 6, thereby healing the etching damage. Thus, stable characteristics can be obtained with no reduction in mobility. The second oxide semiconductor film 32 included in the non-linear element does not suffer etching damage and can lower the carrier concentration, enabling downsizing of the non-linear element.

Then, the second insulation film 11 is deposited so as to cover the entire substrate. The subsequent processes are similar to the processes in the third preferred embodiment and will not be further elaborated here.

Thus, the fourth preferred embodiment improves the stability and the reliability of the characteristics of the TFTs. In addition, the fourth preferred embodiment enables downsizing of the bidirectional diode, which is a non-linear element.

In the configuration described in the first to fourth preferred embodiments, the insulation film (the second insulation film) covering the first insulation film 5, the source electrode 7, the drain electrode 10, and the oxide semiconductor film 31 has been the laminated film including the second insulation film 11 and the third insulation film 12, and the first back electrode 24 has been formed on the laminated film. Alternatively, the above-mentioned insulation film may be an insulation film having a single-layer structure. For example, an insulation film having a low dielectric constant and a thickness of 1 μm or more may be used to reduce the gate capacitance. This structure increases the diode resistance as in the first to fourth preferred embodiments.

In the present invention, the above preferred embodiments can be arbitrarily combined, or each preferred embodiment can be appropriately varied or omitted within the scope of the invention.

While the invention has been shown and described in detail, the foregoing description is in all aspects illustrative and not restrictive. It is therefore understood that numerous modifications and variations can be devised without departing from the scope of the invention.

What is claimed is:

1. An array substrate comprising:
   a substrate; and
   a non-linear element disposed on said substrate and including:
   a light-shielding body disposed on said substrate;
   a first insulation film disposed so as to cover said light-shielding body;
   a first oxide semiconductor film disposed on said first insulation film so as to overlap said light-shielding body in a plan view;

a first source electrode and a first drain electrode that are disposed so as to be apart from each other with a separation portion therebetween on said first oxide semiconductor film;

a second insulation film disposed so as to cover said first oxide semiconductor film, said first source electrode, and said first drain electrode; and a first back electrode disposed on said second insulation film and connected to a source wire through a contact hole, wherein said first back electrode is disposed so as to overlap said first source electrode and part of said separation portion on said first oxide semiconductor film in a plan view, and at least part of said separation portion on said first oxide semiconductor film is not covered with said first back electrode in a plan view.

2. The array substrate according to claim 1, wherein said second insulation film comprises a laminated film including an organic insulation film and an inorganic insulation film disposed on said organic insulation film.

3. The array substrate according to claim 1 for a fringe field switching (FFS) mode.

4. An array substrate comprising:
a substrate; and
a non-linear element disposed on said substrate and including:
a light-shielding body disposed on said substrate;
a first insulation film disposed so as to cover said light-shielding body;
a first oxide semiconductor film disposed on said first insulation film so as to overlap said light-shielding body in a plan view;
a first source electrode and a first drain electrode that are disposed so as to be apart from each other with a separation portion therebetween on said first oxide semiconductor film;
a second insulation film disposed so as to cover said first oxide semiconductor film, said first source electrode, and said first drain electrode;
a second back electrode disposed on said second insulation film;
a third insulation film disposed so as to cover said second back electrode and a surface of said second insulation film; and
a first back electrode disposed on said third insulation film and connected to a source wire through a contact hole, wherein
said first back electrode is disposed so as to overlap said first source electrode and part of said separation portion on said first oxide semiconductor film in a plan view, and
said second back electrode is disposed so as to be connected to a common potential wire and to overlap said first drain electrode and part of said separation portion on said first oxide semiconductor film in a plan view.

5. The array substrate according to claim 4, wherein said first back electrode and said second back electrode are disposed so as to overlap each other, with said third insulation film therebetween, above said first oxide semiconductor film.

6. The array substrate according to claim 4 for a fringe field switching (FFS) mode, said array substrate further comprising:
a comb-teeth shaped electrode made of a material identical to a material of said first back electrode; and a common electrode made of a material identical to a material of said second back electrode.

7. The array substrate according to claim 6, further comprising a thin film transistor (TFT), wherein
said TFT includes:
a second oxide semiconductor film disposed on said first insulation film;
a second source electrode and a second drain electrode disposed so as to be apart from each other on said second oxide semiconductor film; and
a third oxide semiconductor film disposed so as to extend over said second source electrode, said second oxide semiconductor film, and said second drain electrode, and
said non-linear element includes, in place of said first oxide semiconductor film, said third oxide semiconductor film that is disposed so as to extend over said first source electrode, said first oxide semiconductor film, and said first drain electrode.

8. The array substrate according to claim 7 wherein an oxygen concentration of said second oxide semiconductor film is lower than an oxygen concentration of said third oxide semiconductor film.

9. A liquid crystal display comprising:
an array substrate according to claim 6; and
a counter substrate disposed so as to face said array substrate with a liquid crystal layer therebetween.

10. An array substrate comprising:
a substrate; and
a non-linear element disposed on said substrate and including:
a gate wire and a light-shielding body that are disposed so as to be apart from each other on said substrate;
a first insulation film disposed so as to cover said gate wire and said light-shielding body;
a first oxide semiconductor film disposed on said first insulation film so as to overlap said light-shielding body in a plan view;
a first source electrode and a first drain electrode that are disposed so as to be apart from each other with a separation portion therebetween on said first oxide semiconductor film;
a second insulation film disposed so as to cover said first oxide semiconductor film, said first source electrode, and said first drain electrode; and
a first back electrode disposed on said second insulation film and connected to said gate wire and said first source electrode through a contact hole,
wherein said first back electrode is disposed so as to overlap said first source electrode and part of said separation portion on said first oxide semiconductor film in a plan view.

11. The array substrate according to claim 10, wherein said non-linear element further includes:
a second back electrode disposed on said second insulation film; and
a third insulation film disposed so as to cover said second back electrode and a surface of said second insulation film,
said first back electrode is disposed on said third insulation film, and
said second back electrode is disposed so as to be connected to a common potential wire and to overlap said first drain electrode and part of said separation portion on said first oxide semiconductor film in a plan view.

12. The array substrate according to claim 11 for a fringe field switching (FFS) mode, said array substrate further comprising:
- a comb-teeth shaped electrode made of a material identical to a material of said first back electrode; and
- a common electrode made of a material identical to a material of said second back electrode.

13. The array substrate according to claim 12, further comprising a thin film transistor (TFT), wherein
said TFT includes:
- a second oxide semiconductor film disposed on said first insulation film;
- a second source electrode and a second drain electrode disposed so as to be apart from each other on said second oxide semiconductor film; and
- a third oxide semiconductor film disposed so as to extend over said second source electrode, said second oxide semiconductor film, and said second drain electrode, and said non-linear element includes, in place of said first oxide semiconductor film, said third oxide semiconductor film that is disposed so as to extend over said first source electrode, said first oxide semiconductor film, and said first drain electrode.

14. The array substrate according to claim 13, wherein an oxygen concentration of said second oxide semiconductor film is lower than an oxygen concentration of said third oxide semiconductor film.

15. A liquid crystal display comprising:
- an array substrate according to claim 12; and
- a counter substrate disposed so as to face said array substrate with a liquid crystal layer therebetween.

16. The array substrate according to claim 11, wherein said first back electrode and said second back electrode are disposed so as to overlap each other, with said third insulation film therebetween, above said first oxide semiconductor film in a plan view.

17. The array substrate according to claim 10, wherein said second insulation film comprises a laminated film including an organic insulation film and an inorganic insulation film disposed on said organic insulation film.

18. The array substrate according to claim 10, wherein at least part of said separation portion on said first oxide semiconductor film is not covered with said first back electrode in a plan view.

19. The array substrate according to claim 10 for a fringe field switching (FFS) mode.

* * * * *